US009799619B2

(12) United States Patent
Jin et al.

(10) Patent No.: US 9,799,619 B2
(45) Date of Patent: Oct. 24, 2017

(54) ELECTRONIC DEVICE HAVING A REDISTRIBUTION AREA

(71) Applicant: Samsung Electronics Co., Ltd., Suwon-si, Gyeonggi-do (KR)

(72) Inventors: Jeonggi Jin, Seoul (KR); Kyu-Ha Lee, Yongin-si (KR); Jinho Chun, Seoul (KR); Byunglyul Park, Seoul (KR); Jinho An, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/209,298

(22) Filed: Jul. 13, 2016

(65) Prior Publication Data
US 2017/0053882 A1   Feb. 23, 2017

(30) Foreign Application Priority Data
Aug. 21, 2015   (KR) .......................... 10-2015-0118173

(51) Int. Cl.
| | |
|---|---|
| *H01L 23/00* | (2006.01) |
| *H01L 23/31* | (2006.01) |
| *H01L 25/11* | (2006.01) |
| *H01L 21/78* | (2006.01) |
| *H01L 25/00* | (2006.01) |

(52) U.S. Cl.
CPC .............. *H01L 24/09* (2013.01); *H01L 21/78* (2013.01); *H01L 23/3171* (2013.01); *H01L 24/08* (2013.01); *H01L 25/117* (2013.01); *H01L 25/50* (2013.01); *H01L 2224/0231* (2013.01); *H01L 2224/0233* (2013.01); *H01L 2224/0401* (2013.01); *H01L 2224/08059* (2013.01); *H01L 2224/08111* (2013.01); *H01L 2225/0652* (2013.01); *H01L 2225/06541* (2013.01)

(58) Field of Classification Search
CPC ..... H01L 24/09; H01L 25/50; H01L 23/3171; H01L 24/10; H01L 23/49816; H01L 23/5383; H01L 2224/10; H01L 2224/13019

See application file for complete search history.

(56) References Cited

U.S. PATENT DOCUMENTS

| | | |
|---|---|---|
| 7,545,027 B2 | 6/2009 | Chung et al. |
| 7,825,511 B2 | 11/2010 | Daubenspeck et al. |

(Continued)

FOREIGN PATENT DOCUMENTS

| | | |
|---|---|---|
| JP | 2006-024902 A | 1/2006 |
| KR | 10-2014-0008173 A | 1/2014 |

(Continued)

*Primary Examiner* — Nathan W Ha
(74) *Attorney, Agent, or Firm* — Myers Bigel, P.A.

(57) ABSTRACT

An electronic device includes an upper insulating layer on a substrate. An upper redistribution structure is embedded in the upper insulating layer. The upper redistribution structure includes an upper contact portion, an upper pad portion, and an upper line portion between the upper contact portion and the upper pad portion. A passivation layer is on the upper insulating layer and the upper redistribution structure. An upper opening is configured to pass through the passivation layer and expose the upper pad portion. Vertical thicknesses of the upper pad portion and the upper contact portion are greater than a vertical thickness of the upper line portion.

20 Claims, 31 Drawing Sheets

(56) References Cited

U.S. PATENT DOCUMENTS

| | | | |
|---|---|---|---|
| 8,138,099 B1* | 3/2012 | Daubenspeck | B81C 1/00325 438/754 |
| 8,304,907 B2 | 11/2012 | Lin et al. | |
| 8,420,520 B2* | 4/2013 | Lin | C25D 3/48 257/E21.023 |
| 8,431,479 B2 | 4/2013 | Kim et al. | |
| 8,637,402 B2 | 1/2014 | Hu et al. | |
| 9,035,468 B2 | 5/2015 | Shih et al. | |
| 2005/0269206 A1 | 12/2005 | Tanaka et al. | |
| 2006/0017161 A1 | 1/2006 | Chung et al. | |
| 2010/0203723 A1* | 8/2010 | Sameshima | H01L 24/03 438/631 |
| 2010/0276787 A1 | 11/2010 | Yu et al. | |
| 2010/0314765 A1 | 12/2010 | Liang et al. | |
| 2013/0127024 A1* | 5/2013 | Lin | H01L 21/76816 257/659 |
| 2014/0035127 A1* | 2/2014 | Hirtreiter | H01L 21/283 257/737 |
| 2014/0048952 A1 | 2/2014 | Lee et al. | |
| 2014/0054802 A1 | 2/2014 | Shim et al. | |
| 2014/0252597 A1* | 9/2014 | Tsai | H01L 23/3171 257/737 |
| 2014/0264837 A1* | 9/2014 | Chen | H01L 24/11 257/737 |
| 2015/0014851 A1 | 1/2015 | Lu et al. | |
| 2015/0214170 A1* | 7/2015 | Chen | H01L 24/11 257/737 |

FOREIGN PATENT DOCUMENTS

| | | |
|---|---|---|
| KR | 10-2014-0024674 A | 3/2014 |
| KR | 10-2014-0028642 A | 3/2014 |

* cited by examiner

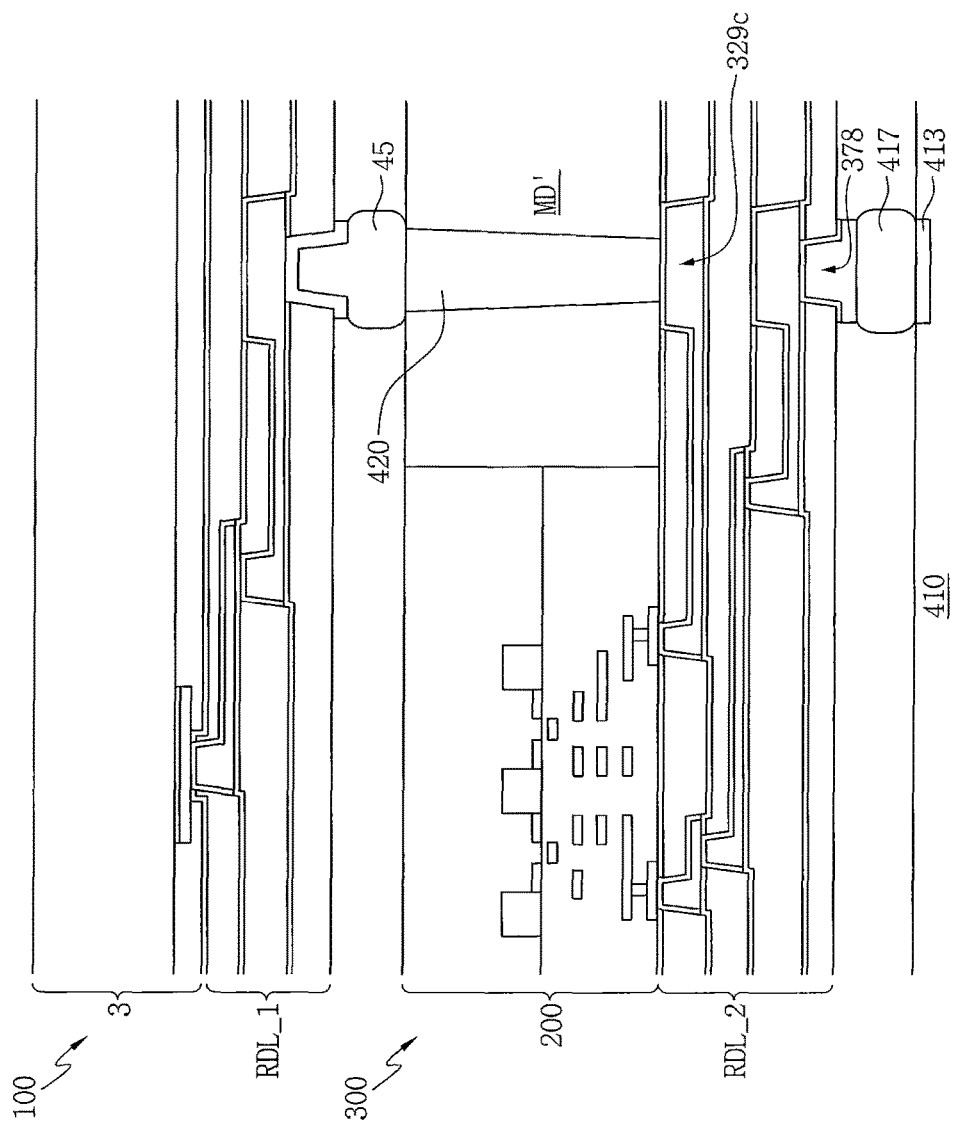

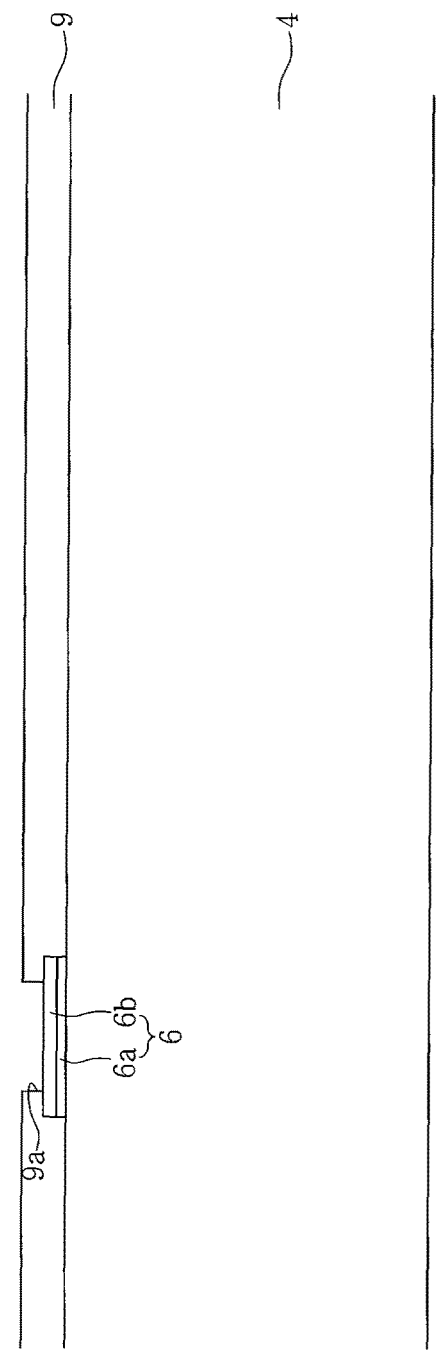

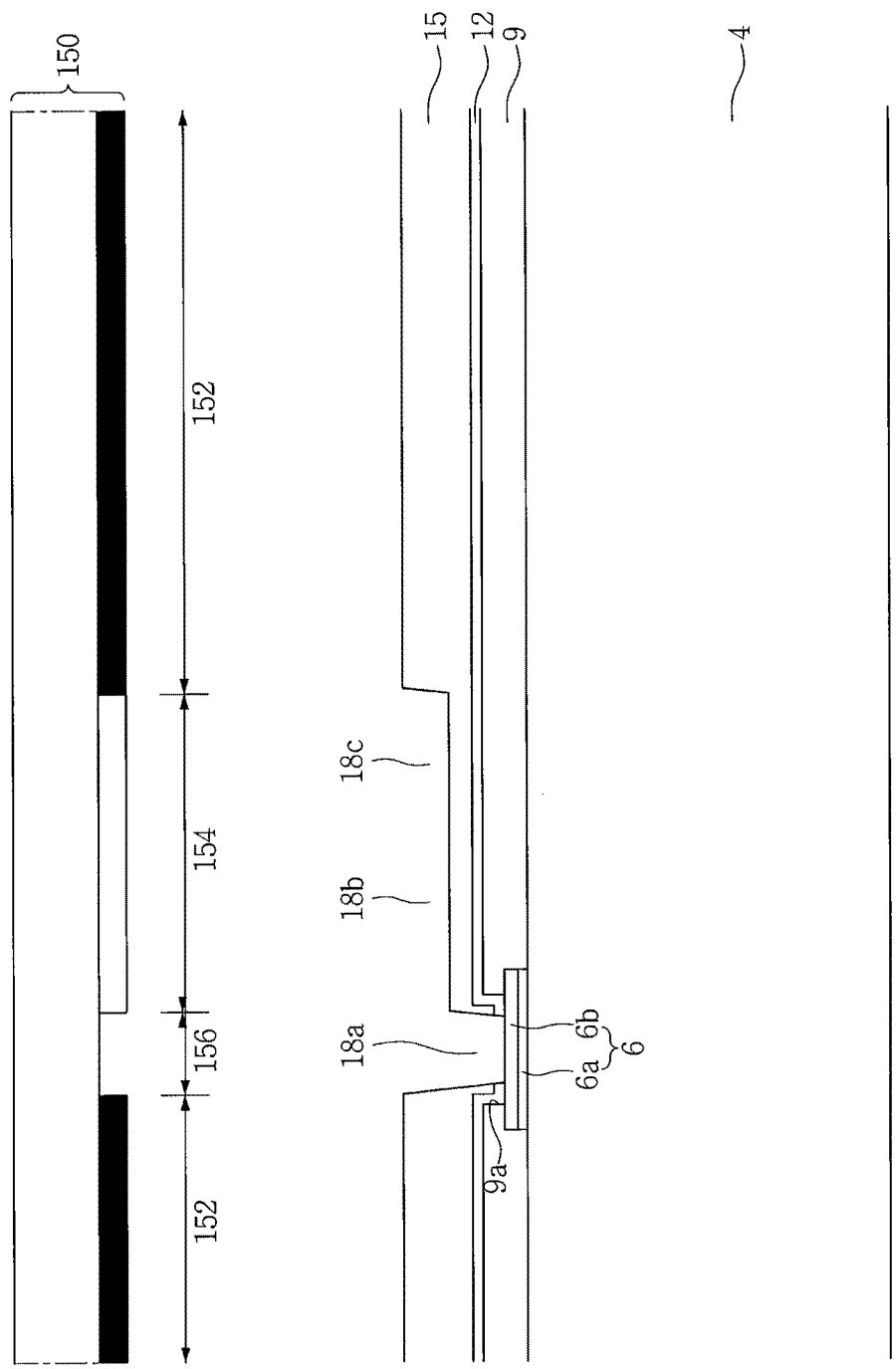

ELECTRONIC DEVICE HAVING A REDISTRIBUTION AREA

CROSS-REFERENCE TO RELATED APPLICATION

This application claims priority under 35 U.S.C. §119 to Korean Patent Application No. 10-2015-0118173 filed on Aug. 21, 2015, the disclosure of which is hereby incorporated by reference in its entirety.

BACKGROUND

Technical Field

Embodiments of the inventive concept relate to an electronic device having a redistribution area and a method of manufacturing the same.

Description of Related Art

While electronic products (e.g., mobile phone, tablet PC, or the like) having further improved functions and/or smaller size are desired, the requirements for components constituting the electronic products, for example, electronic devices are being increased. For example, redistribution structures for use in an electronic device such as a semiconductor chip or the like, various semiconductor packages, and/or electronic systems is being studied and developed.

SUMMARY

In accordance with an embodiment of the inventive concept, an electronic device is provided. The electronic device includes an upper insulating layer on a substrate. An upper redistribution structure is embedded in the upper insulating layer. The upper redistribution structure includes an upper contact portion, an upper pad portion, and an upper line portion between the upper contact portion and the upper pad portion. A passivation layer is on the upper insulating layer and the upper redistribution structure. An upper opening is disposed to pass through the passivation layer and expose the upper pad portion. Vertical thicknesses of the upper pad portion and the upper contact portion are greater than a vertical thickness of the upper line portion.

In an embodiment, the upper insulating layer may have an upper contact opening, an upper line recess, and an upper pad opening, the upper contact opening and the upper pad opening may pass through the upper insulating layer, and the upper line recess may connect an upper portion of the upper contact opening to an upper portion of the upper pad opening.

In an embodiment, the upper contact portion may be in the upper contact opening, the upper pad portion may be in the upper pad opening, and the upper line portion may be in the upper line portion.

In an embodiment, the upper redistribution structure may include a first conductive material layer and a second conductive material layer, and the first conductive material layer may cover a lower surface and lateral surfaces of the second conductive material layer.

In an embodiment, an upper surface of the upper redistribution structure may be lower than an upper surface of the upper insulating layer relative to the substrate.

In an embodiment, the upper insulating layer may be formed of a photosensitive polyimide material.

In an embodiment, the electronic device may further include a lower insulating layer between the upper insulating layer and the substrate, and a lower redistribution structure in the lower insulating layer and including a lower contact portion, a lower pad portion, and a lower line portion disposed between the lower contact portion and the lower pad portion.

In an embodiment, the lower insulating layer may include a lower contact opening, a lower line recess, and a lower pad recess, the lower contact opening may pass through the lower insulating layer, the lower line recess and the lower pad recess may not pass through the lower insulating layer, the lower contact portion may be in the lower contact opening, the lower pad portion may be in the lower pad recess, and the lower line portion may be in the lower line recess.

In an embodiment, the lower contact portion may have a greater vertical thickness than the lower line portion and the lower pad portion.

In an embodiment, the electronic device may further include a connection pattern on the upper pad portion exposed by the upper opening.

In accordance with an embodiment of the inventive concept, an electronic device is provided. The electronic device includes a semiconductor chip, a molding pattern on lateral surfaces of the semiconductor chip, a redistribution area which covers the semiconductor chip and the molding pattern, and a connection pattern on the redistribution area. The redistribution area includes an upper insulating layer which covers the semiconductor chip and the molding pattern, a passivation layer on the upper insulating layer, and an upper redistribution structure disposed in the upper insulating layer. The upper redistribution structure includes an upper contact portion, an upper pad portion, and an upper line portion between the upper contact portion and the upper pad portion. The upper redistribution structure includes a first upper conductive material layer and a second upper conductive material layer. The first upper conductive material layer covers a lower surface and lateral surfaces of the second upper conductive material layer.

In an embodiment, the connection pattern may be on the upper pad portion of the upper redistribution structure and may overlap the molding pattern.

In an embodiment, the upper pad portion may have a greater vertical thickness than the upper line portion.

In an embodiment, the electronic device may further include a lower redistribution structure under the upper redistribution structure, and the lower redistribution structure may include a lower contact portion, a lower pad portion, and a lower line portion disposed between the lower contact portion and the lower pad portion.

In an embodiment, the lower pad portion may have the same vertical thickness as the lower line portion and the upper pad portion may have a greater vertical thickness than the upper line portion.

In accordance with an embodiment of the inventive concept, an electronic device is provided. The electronic device includes a base substrate, a first semiconductor device disposed on the base substrate, and a lower connection structure which connects the first semiconductor device to the base substrate. The first semiconductor device includes a redistribution area facing the base substrate, a first semiconductor chip and a molding pattern, which are both on the redistribution area, a first redistribution area on the first semiconductor chip and the molding pattern and facing the base substrate, and a first connection pattern which electrically connects the redistribution area to the lower connection structure. The redistribution area includes a first redistribution structure and a second redistribution structure. The redistribution area includes an upper insulating layer and a passivation layer closer to the base substrate than the upper insulating layer. The upper insulating layer and the passivation layer overlap the first semiconductor chip and the molding pattern. The first redistribution structure includes an upper redistribution structure disposed in the upper insulating layer. The upper redistribution structure includes an upper contact portion, an upper pad portion, and an upper line portion. The first connection pattern passes through the passivation layer and is electrically connected to the upper pad portion.

In an embodiment, the redistribution area may further include a lower insulating layer and a lower redistribution structure in the lower insulating layer, and the upper insulating layer may be closer to the base substrate than the lower insulating layer.

In an embodiment, the lower redistribution structure and the second redistribution structure may be in the lower insulating layer, the lower redistribution structure may include a lower contact portion, a lower pad portion, and a lower line portion between the lower contact portion and the lower pad portion, the second redistribution structure may include a second contact portion, a second pad portion, and a second line portion between the second contact portion and the second pad portion, and the second pad portion may have a greater thickness than the second line portion, the lower line portion, and the lower pad portion.

In an embodiment, the electronic device may further include a second semiconductor device on the first semiconductor device and the molding pattern and a connection structure which electrically connects the second connection pattern of the second semiconductor device to the lower pad portion of the lower redistribution structure, and the connection structure may include a part passing through the molding pattern.

In an embodiment, the second redistribution structure may include a second contact portion, a second pad portion, and a second line portion which connects the second contact portion to the second pad portion, the second contact portion may overlap the semiconductor chip, and the second pad portion may overlap the molding pattern.

In accordance with an embodiment of the inventive concept, an electronic device is provided. The electronic device includes a substrate having a first side and a second side, which are opposite to each other, a first redistribution area on the first side of the substrate, a first upper connection pattern and a second upper connection pattern, which are on the first redistribution area, adjacent to each other, and spaced apart by a first distance, and a first through via structure and a second through via structure, which pass through the substrate. The first redistribution area includes an upper insulating layer, and a first upper redistribution structure and a second upper redistribution structure, which are embedded in the upper insulating layer and spaced apart from each other. Each of the first and second upper redistribution structures includes a first conductive material layer and a second conductive material layer. The first conductive material layer covers a lower surface and lateral surfaces of the second conductive material layer. Upper surfaces of the first and second upper redistribution structures are lower than an upper surface of the upper insulating layer relative to the substrate.

In an embodiment, each of the first and second upper redistribution structures may include an upper contact portion, an upper pad portion, and an upper line portion between the upper contact portion and the upper pad portion, the first upper connection pattern may be electrically connected to the upper pad portion of the first upper redistribution structure, and the second upper connection pattern may be electrically connected to the upper pad portion of the second upper redistribution structure.

In an embodiment, the electronic device may further include a base facing the first and second lower connection patterns, lower ball structures which connect the base to the first and second lower connection patterns, a first semiconductor device facing the first redistribution area, and upper ball structures which connect the first and second upper connection patterns to the first semiconductor device.

In an embodiment, the electronic device may further include a second semiconductor device spaced apart from the first semiconductor device and facing the first redistribution area.

In an embodiment, the electronic device may further include a lower insulating layer between the first side of the substrate and the upper insulating layer and a first lower redistribution structure and a second lower redistribution structure, which are embedded in the lower insulating layer and spaced apart from each other, and each of the first and second lower redistribution structures may include a lower contact portion disposed in a lower contact opening passing through the lower insulating layer, a lower pad portion disposed in a lower pad recess of the lower insulating layer, and a lower line portion disposed in a lower line recess of the lower insulating layer, the lower contact portion of the first lower redistribution structure may be electrically connected to the first through via structure, and the lower contact portion of the second lower redistribution structure may be electrically connected to the second through via structure.

In accordance with an embodiment of the inventive concept, an electronic device comprises a substrate, a lower insulating layer on the substrate, a lower redistribution structure in the lower insulating layer, an upper insulating layer on the lower insulating layer, and an upper redistribution structure in the upper insulating layer. The upper redistribution structure comprising an upper contact portion, an upper pad portion, and an upper line portion that connects the upper contact portion to the upper pad portion. The upper contact portion extending through the upper insulating layer to contact the lower redistribution structure.

In an embodiment, a vertical thickness of the upper contact portion is greater than a vertical thickness of the upper line portion, and a vertical thickness of the upper pad portion is greater than the vertical thickness of the upper line portion.

In an embodiment, an upper surface of the upper redistribution structure is lower than an upper surface of the upper insulating layer relative to the substrate and an upper surface of the lower redistribution structure is lower than an upper surface of the lower insulating layer relative to the substrate.

In an embodiment, the electronic device further comprises a passivation layer on the upper insulating layer and a connection pattern that extends through an opening in the passivation layer to contact the upper pad portion.

In an embodiment, a planar area of the upper pad portion is greater than a planar area of the upper contact portion and the planar area of the upper pad portion is greater than a planar area of a bottom of the connection pattern that contacts the upper pad portion.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the inventive concepts are explained in detail in the specification set forth below.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 6A is a cross-sectional view illustrating an example of an electronic device in accordance with an embodiment of the inventive concept and FIG. 6B is a cross-sectional view illustrating a part of FIG. 6A;

FIGS. 11A to 11E are cross-sectional views illustrating an example of a method of forming an electronic device in accordance with an embodiment of the inventive concept.

DETAILED DESCRIPTION OF THE EMBODIMENTS

Figure 1:
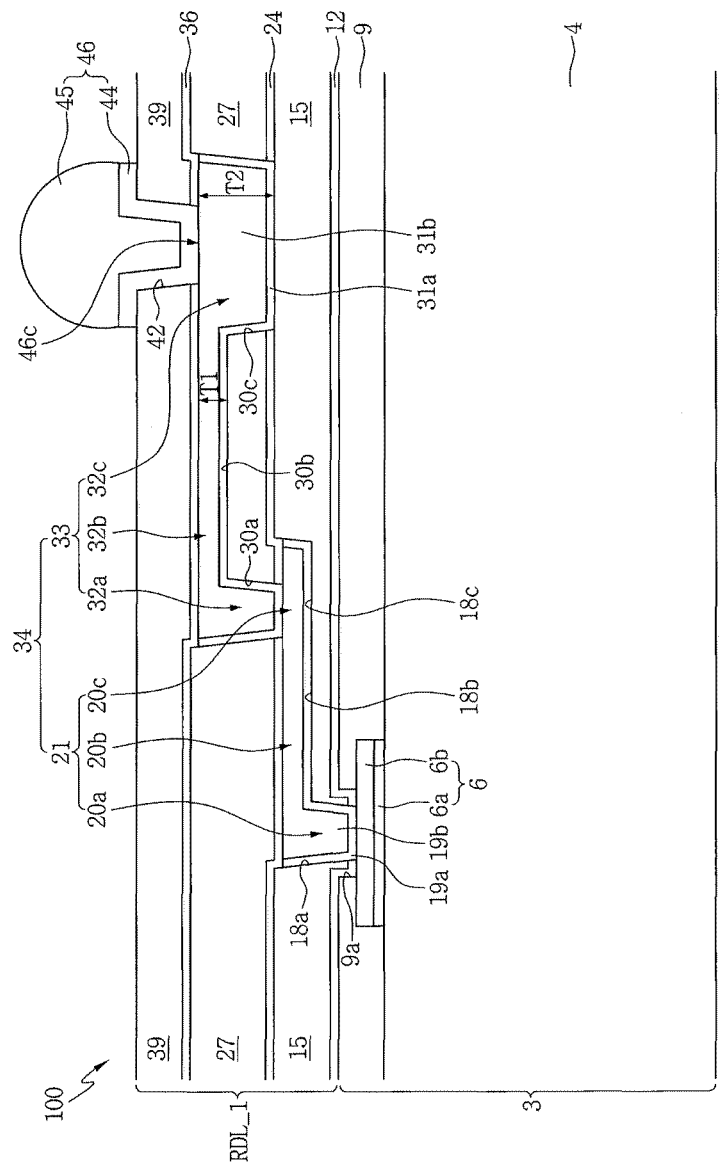
FIG. 1 is a cross-sectional view illustrating an example of an electronic device in accordance with an embodiment of the inventive concept.

Advantages and features of the inventive concept and methods of accomplishing them will be made apparent with reference to the accompanying drawings and some embodiments to be described below. The inventive concept may, however, be embodied in various different forms, and should be construed as limited, not by the embodiments set forth herein, but only by the accompanying claims. Rather, these embodiments are provided so that this disclosure is thorough and complete and fully conveys the inventive concept to those skilled in the art.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present.

Like reference numerals throughout this specification denote like elements. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another/other element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The exemplary embodiments of the invention will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of the invention are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are set forth to illustrate special forms of the areas of a device, and are not intended to limit the scope of the invention.

Like numbers refer to like elements throughout the description. Thus, the same or similar numbers may be described with reference to other drawings even if they are neither mentioned nor described in the corresponding drawing. Also, elements that are not denoted by reference numbers may be described with reference to other drawings.

Terms such as "front side," and "back side" may be used in a relative sense herein to facilitate easy understanding of the inventive concept. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side. Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
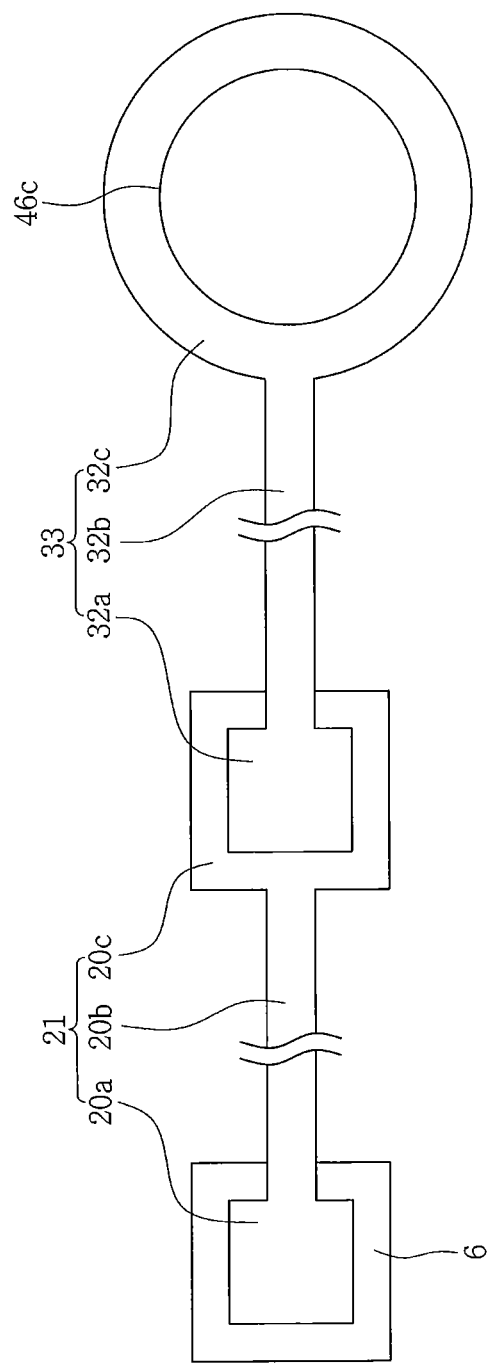
FIG. 2A is a top view illustrating an example of a redistribution structure of an electronic device in accordance with an embodiment of the inventive concept.

FIG. 1 is a cross-sectional view illustrating an example of an electronic device in accordance with an embodiment of the inventive concept. FIG. 2A is a top view illustrating an example of a redistribution structure of an electronic device in accordance with an embodiment of the inventive concept.

Referring to FIGS. 1 and 2A, an electronic device 100 including a base area 3, a redistribution area RDL_1 disposed on the base area 3, and a connection pattern 46 disposed on the redistribution area RDL_1 may be provided. The electronic device 100 may be a semiconductor device or an interposer.

The base area 3 may include a substrate 4 as well as a conductive pattern 6 and a protective layer 9, which are disposed on the substrate 4. The substrate 4 may include a semiconductor substrate of a semiconductor device or a substrate of an interposer. The conductive pattern 6 may be a conductive pad or a through via structure, which is electrically connected to the substrate 4. The conductive pattern 6 may include a barrier layer 6a and a pad layer 6b disposed on the barrier layer 6a. The protective layer 9, which is disposed on the substrate 4, may have an opening 9a for exposing a part of an upper surface of the conductive pattern 6. The protective layer 9 may be formed of an insulating material, such as silicon nitride, silicon oxide, or the like. However, embodiments of the inventive concept are not limited thereto. For example, the protective layer 9 may be formed of a polymer-based insulating material.

The redistribution area RDL_1 may include a lower insulating layer 15, an upper insulating layer 27, and a passivation layer 39, which are sequentially stacked on the base area 3. Further, the redistribution area RDL_1 may include a redistribution structure 34, which electrically connects the conductive pattern 6 to the connection pattern 46. Further, the redistribution area RDL_1 may include a lower insulating barrier layer 12 disposed between the base area 3 and the lower insulating layer 15, an intermediate insulating barrier layer 24 disposed between lower insulating layer 15 and the upper insulating layer 27, and an upper insulating barrier layer 36 disposed between the upper insulating layer 27 and the passivation layer 39. The lower, intermediate, and upper insulating barrier layers 12, 24, and 36 may be formed of an insulating material, such as silicon nitride or the like.

The lower insulating layer 15 may have a lower contact opening 18a, a lower pad recess 18c, and a lower line recess 18b. The lower contact opening 18a may pass through the lower insulating layer 15, and the lower line recess 18b and the lower pad recess 18c may not pass through the lower insulating layer 15. The lower line recess 18b may connect an upper portion of the lower contact opening 18a to the lower pad recess 18c. The lower insulating layer 15 may be formed of a photosensitive polyimide material. The lower contact opening 18a, the lower pad recess 18c, and the lower line recess 18b may be formed by performing a single photolithography process in which one photomask including parts having different light transmittances is used.

The upper insulating layer 27 may have an upper contact opening 30a, an upper pad opening 30c, and an upper line recess 30b. The upper contact opening 30a and the upper pad opening 30c may pass through the upper insulating layer 27. The upper line recess 30b may be connected to an upper portion of the upper contact opening 30a and an upper portion of and the upper pad opening 30c. The upper insulating layer 27 may be formed of a photosensitive polymer-based material, for example, a photosensitive polyimide material. The upper contact opening 30a, the upper pad opening 30c, and the upper line recess 30b may be formed by performing a single photolithography process in which one photomask including parts having different light transmittances is used.

The redistribution structure 34 may include a lower redistribution structure 21 embedded in the lower insulating layer 15 and an upper redistribution structure 33 embedded in the upper insulating layer 27.

The lower redistribution structure 21 may include a lower contact portion 20a, a lower pad portion 20c, and a lower line portion 20b. The lower contact portion 20a may be disposed in the lower contact opening 18a, may pass through the lower insulating barrier layer 12, and may be physically and/or electrically connected to the conductive pattern 6. The lower pad portion 20c may be disposed in the lower pad recess 18c, and the lower line portion 20b may be disposed in the lower line recess 18b.

To prevent or reduce the likelihood of electrical failure or electrical short with the other adjacent lower redistribution structure disposed on the same plane from being generated, an upper surface of the lower redistribution structure 21 may be disposed at a lower level than an upper surface of the lower insulating layer 15.

The upper redistribution structure 33 may include an upper contact portion 32a, an upper pad portion 32c, and an upper line portion 32b. The upper contact portion 32a may be disposed in the upper contact opening 30a, may pass through the intermediate insulating barrier layer 24, and may be physically and/or electrically connected to the lower pad portion 20c. The upper pad portion 32c may be disposed in the upper pad opening 30c, and the upper line portion 32b may be disposed in the upper line recess 30b.

To prevent or reduce the likelihood of electrical failure or electrical short with the other adjacent upper redistribution structure disposed on the same plane from being generated, an upper surface of the upper redistribution structure 33 may be disposed at a lower level than an upper surface of the upper insulating layer 27.

A lower surface 46c of the connection pattern 46 in contact with the upper pad portion 32c of the upper redistribution structure 33 may have a smaller width than the upper pad portion 32c.

The upper and lower redistribution structures 33 and 21 may include first conductive material layers 31a and 19a and second conductive material layers 31b and 19b, respectively. The first conductive material layers 31a and 19a may cover lower surfaces and lateral surfaces of the second conductive material layers 31b and 19b, respectively. The first conductive material layers 31a and 19a may include a barrier layer and/or a seed layer, and the second conductive material layers 31b and 19b may include a copper layer. The second conductive material layers 31b and 19b may include a copper layer formed by performing an electroplating method using a seed layer of the first conductive material layers 31a and 19a. The seed layer may be a copper seed layer. The upper and lower redistribution structures 33 and 21 may include Ti, TiW, and/or a copper (Cu) material, respectively.

In the upper redistribution structure 33, a vertical thickness T2 of the upper pad portion 32c may be greater than a vertical thickness T1 of the upper line portion 32b. The upper contact portion 32a may have substantially the same vertical thickness as the upper pad portion 32c. The thicknesses of the upper contact portion 32a and the upper pad portion 32c may be greater than the thickness of the upper line portion 32b.

A size of the upper pad portion 32c may be greater than a size of the upper contact portion 32a. A width of the upper pad portion 32c may be greater than a width of the upper contact portion 32a. A planar area of the upper pad portion 32c may be greater than a planar area of the upper contact portion 32a. The planar area of the upper pad portion 32c may be greater than a planar area of a bottom of the connection pattern 46.

Figure 2B:
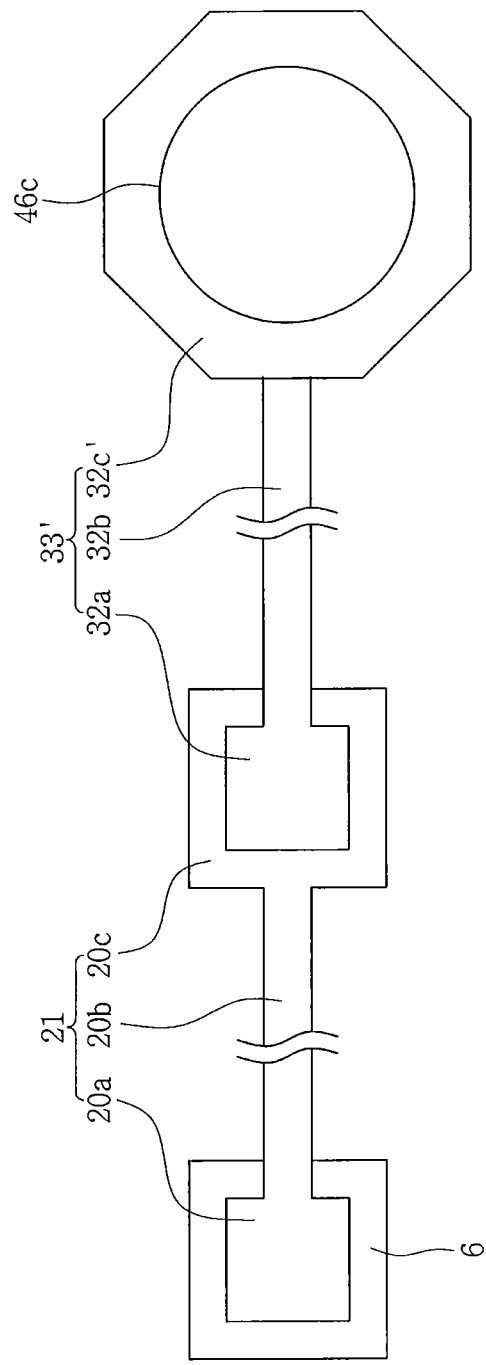
FIG. 2B is a top view illustrating an example of a redistribution structure of an electronic device in accordance with an embodiment of the inventive concept.

A plane shape of the upper pad portion 32c may be different from a plane shape of the upper contact portion 32a. In the upper redistribution structure 33, the upper pad portion 32c may be a circular shape. However, the inventive concept is not limited thereto. For example, instead of the upper redistribution structure 33 including the upper pad portion 32c having a circular shape, as illustrated in FIG. 2B, an upper redistribution structure 33' including a first pad portion 32c' having a polygonal shape, for example, an octagonal shape may be provided.

In an embodiment, the connection pattern 46 may protrude from the passivation layer 39 while the connection pattern 46 may be disposed in an upper opening 42 passing through the passivation layer 39 and the upper insulating barrier layer 36.

Figure 3:
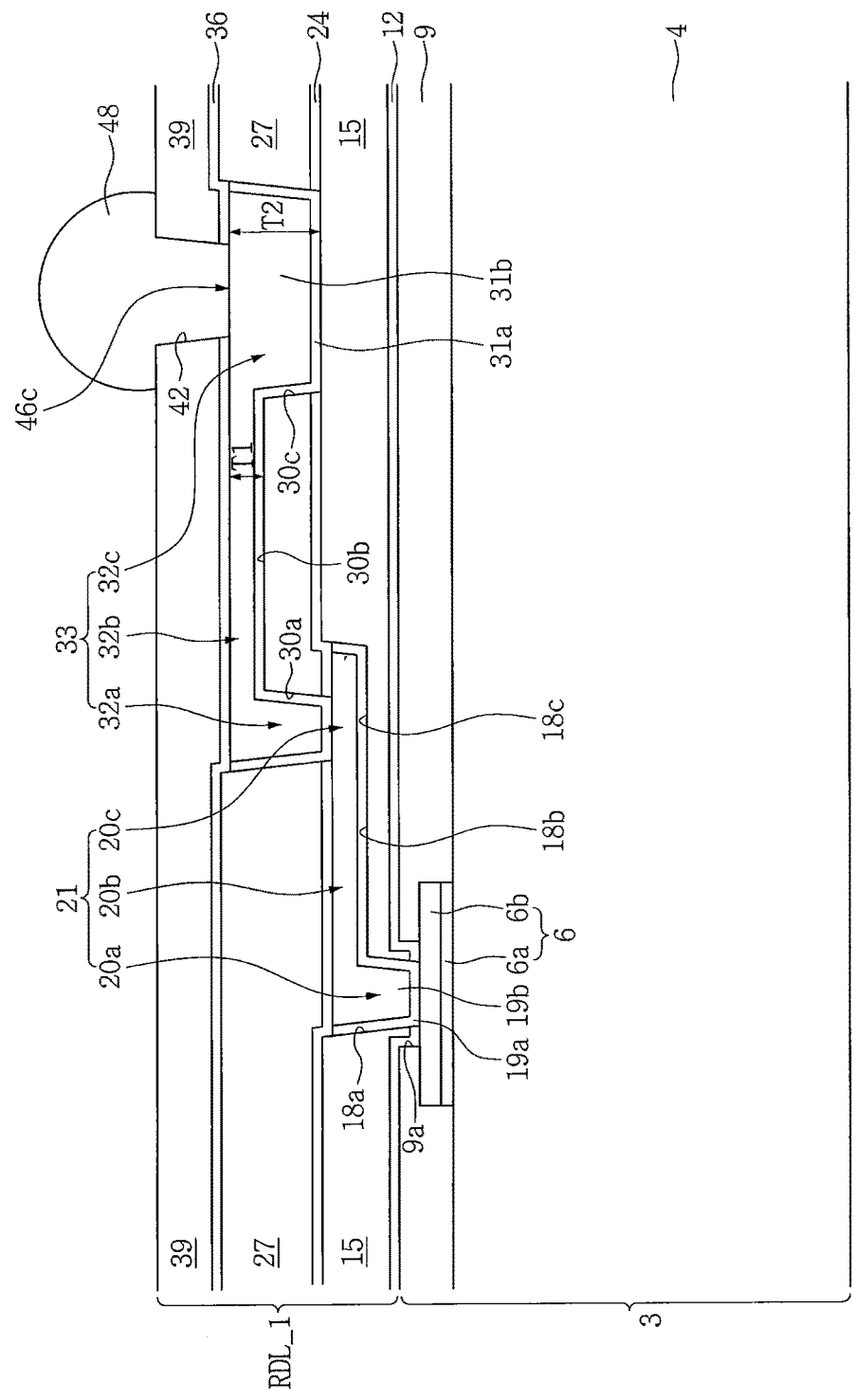
FIG. 3 is a cross-sectional view illustrating an example of an electronic device in accordance with an embodiment of the inventive concept.

In an embodiment, the connection pattern 46 may include a first connection conductive material layer 44 and a second connection conductive material layer 45 disposed on the first connection conductive material layer 44. The first connection conductive material layer 44 may be a conductive bump 44, and the second connection conductive material layer 45 may be a solder ball including a solder material. However, embodiments of the inventive concept are not limited thereto. For example, as illustrated in FIG. 3, a connection pattern 48 formed of a solder may be provided. The connection pattern 48 illustrated in FIG. 3 is formed of a solder material, and may be directly in contact with and electrically connected to the upper pad portion 32c of the upper redistribution structure 33.

In the redistribution area RDL_1, the lower insulating layer 15 and the upper insulating layer 27 may be formed of a photosensitive polyimide material. The lower contact opening 18a, the lower pad recess 18c, and the lower line recess 18b of the lower insulating layer 15 may be simultaneously formed by performing a single photolithography process in which one photomask including parts having different light transmittances is used. Further, the upper contact opening 30a, the upper pad opening 30c, and the upper line recess 30b of the upper insulating layer 27 may be simultaneously formed by performing a single photolithography process in which one photomask including parts having different light transmittances is used. Then, each of the lower redistribution structure 21 and the upper redistribution structure 33 may be formed by performing a planarization process and/or an etching process on a conductive material layer after the conductive material layer is formed by performing a deposition process and/or an electroplating process. Therefore, because a photolithography process for forming the redistribution area RDL_1 may be simplified, production costs can be reduced.

In the redistribution area RDL_1, the lower redistribution structure 21 may be embedded in the lower insulating layer 15, and the upper redistribution structure 33 may be embedded in the upper insulating layer 27. Therefore, in the redistribution area RDL_1, defects such as undercuts or the like may be prevented from being generated.

In the redistribution area RDL_1, the upper pad portion 32c of the upper redistribution structure 33 may be formed to have a greater thickness than the upper line portion 32b. The upper pad portion 32c may be in contact with the connection pattern 46 serving as a solder ball structure or a bump. Stress may be applied to the upper pad portion 32c due to the connection pattern 46, but because the upper pad portion 32c may be formed to have a large thickness, defects, such as cracks or the like due to stress, may be prevented from being generated or the likelihood of their generation reduced on the upper pad portion 32c.

Figure 4:
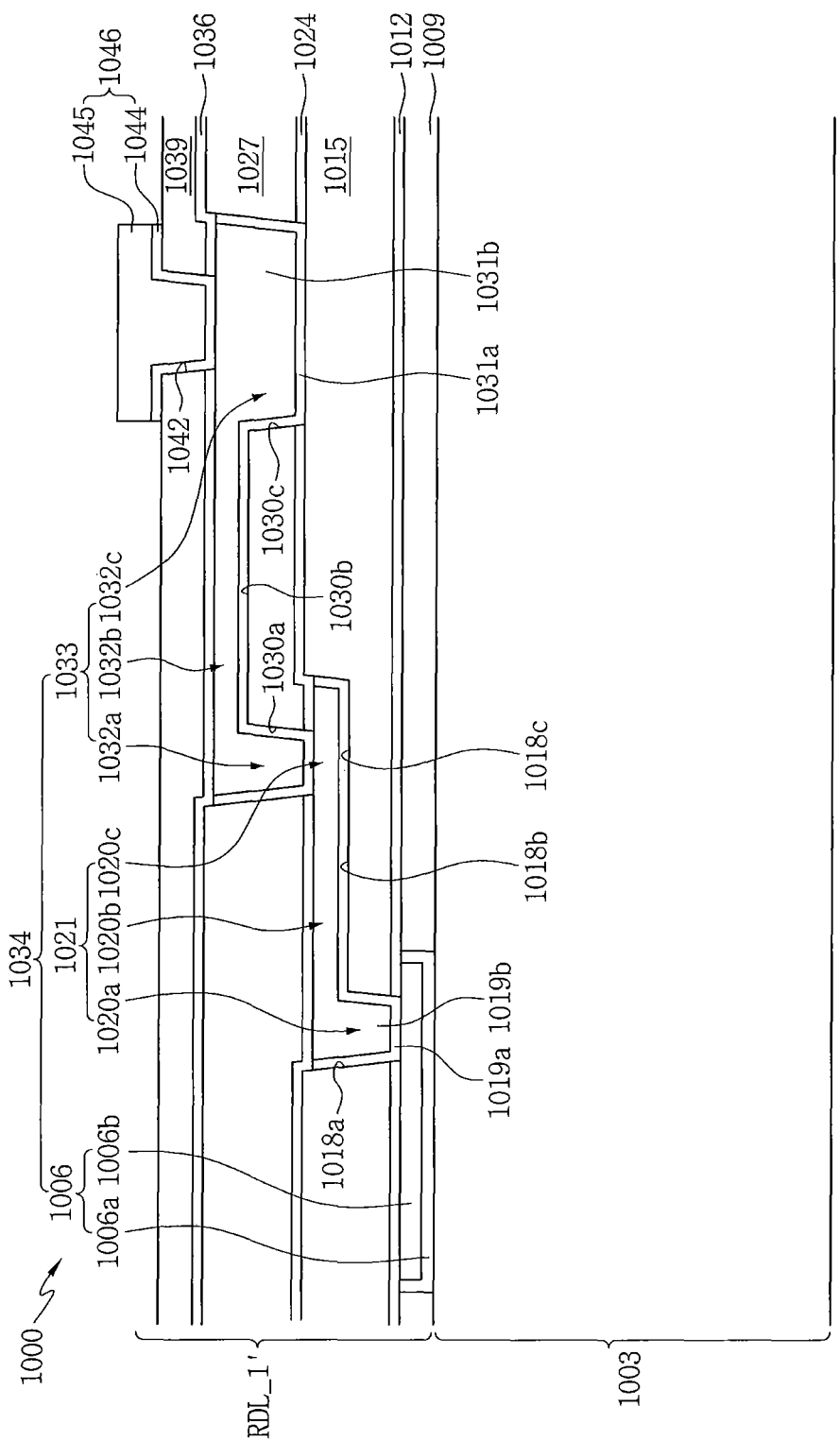
FIG. 4 is a cross-sectional view illustrating an example of an electronic device in accordance with an embodiment of the inventive concept.

FIG. 4 is a cross-sectional view illustrating an example of an electronic device in accordance with an embodiment of the inventive concept. An example 1000 of an electronic device in accordance with an embodiment of the inventive concept will be described with reference to FIG. 4.

Referring to FIG. 4, an electronic device 1000 including a base area 1003, a redistribution area RDL_1' disposed on the base area 1003, and a connection pattern 1046 may be provided. The electronic device 1000 may be a semiconductor device or an interposer. The base area 1003 may include a semiconductor substrate of a semiconductor device or a substrate of an interposer.

The redistribution area RDL_1' may include a lower insulating layer 1009, an intermediate insulating layer 1015, an upper insulating layer 1027, and a passivation layer 1039, which are sequentially stacked on the base area 1003. Further, the redistribution area RDL_1' may include a lower insulating barrier layer 1012 disposed between the lower insulating layer 1009 and the intermediate insulating layer 1015, an intermediate insulating barrier layer 1024 disposed between the intermediate insulating layer 1015 and the upper insulating layer 1027, and an upper insulating barrier layer 1036 disposed between the upper insulating layer 1027 and the passivation layer 1039. Further, the redistribution area RDL_1' may include a lower redistribution structure 1006 disposed in the lower insulating layer 1009, an intermediate redistribution structure 1021 disposed in the intermediate insulating layer 1015, and an upper redistribution structure 1033 disposed in the upper insulating layer 1027.

The lower redistribution structure 1006 may be disposed in the lower insulating layer 1009. The lower redistribution structure 1006 may include a second conductive material layer 1006b and a first conductive material layer 1006a, which covers a lower surface and lateral surfaces of the second conductive material layer 1006b.

The lower insulating layer 1009 may be formed of a photosensitive polymer-based material, for example, a photosensitive polyimide material. The lower redistribution structure 1006 may include Ti, TiW, and/or a copper (Cu) material.

The intermediate insulating layer 1015 and the intermediate redistribution structure 1021 may be formed to have substantially the same structure and/or the same material as the lower insulating layer 15 and the lower redistribution structure 21 described in FIG. 1, respectively. For example, the intermediate redistribution structure 1021 may include an intermediate contact portion 1020a disposed in an intermediate contact opening 1018a passing through the intermediate insulating layer 1015, an intermediate pad portion 1020c disposed in an intermediate pad recess 1018c disposed in the intermediate insulating layer 1015, and an intermediate line portion 1020b disposed in an intermediate line recess 1018b disposed in the intermediate insulating layer 1015. The intermediate redistribution structure 1021 may include a second conductive material layer 1019b and a first conductive material layer 1019a, which covers a lower surface and lateral surfaces of the second conductive material layer 1019b. The intermediate insulating layer 1015 may be formed of a photosensitive polyimide material. The intermediate redistribution structure 1021 may include Ti, TiW, and/or a copper (Cu) material.

The upper insulating layer 1027 and the upper redistribution structure 1033 may be formed to have substantially the same structure and/or the same material as the upper insulating layer 27 and the upper redistribution structure 33 described in FIG. 1, respectively. For example, the upper redistribution structure 1033 may include an upper contact portion 1032a disposed in an upper contact opening 1030a passing through the upper insulating layer 1027, an upper pad portion 1032c disposed in an upper pad opening 1030c passing through the upper insulating layer 1027, and an upper line portion 1032b disposed in an upper line recess 1030b disposed in the upper insulating layer 1027.

The upper redistribution structure 1033 may include a second conductive material layer 1031b and a first conductive material layer 1031a, which covers a lower surface and lateral surfaces of the second conductive material layer 1031b. The upper insulating layer 1027 may be formed of a photosensitive polyimide material. The upper redistribution structure 1033 may include Ti, TiW, and/or a copper (Cu) material.

The upper contact portion 1032a of the upper redistribution structure 1033 may pass through the intermediate insulating barrier layer 1024 and may be directly in contact with and electrically connected to the intermediate pad portion 1020c of the intermediate redistribution structure 1021, and the intermediate contact portion 1020a of the intermediate redistribution structure 1021 may pass through the lower insulating barrier layer 1012 and may be directly in contact with and electrically connected to the lower redistribution structure 1006. The upper redistribution structure 1033 may include a second conductive material layer 1031b and a first conductive material layer 1031a, which covers a lower surface and lateral surfaces of the second conductive material layer 1031b.

The connection pattern 1046 may protrude from the passivation layer 1039 while disposed in an upper opening 1042 passing through the passivation layer 1039 and the upper insulating barrier layer 1036. The connection pattern 1046 may include a first connection conductive material layer 1044 and a second connection conductive material layer 1045 disposed on the first connection conductive material layer 1044.

Figure 5:
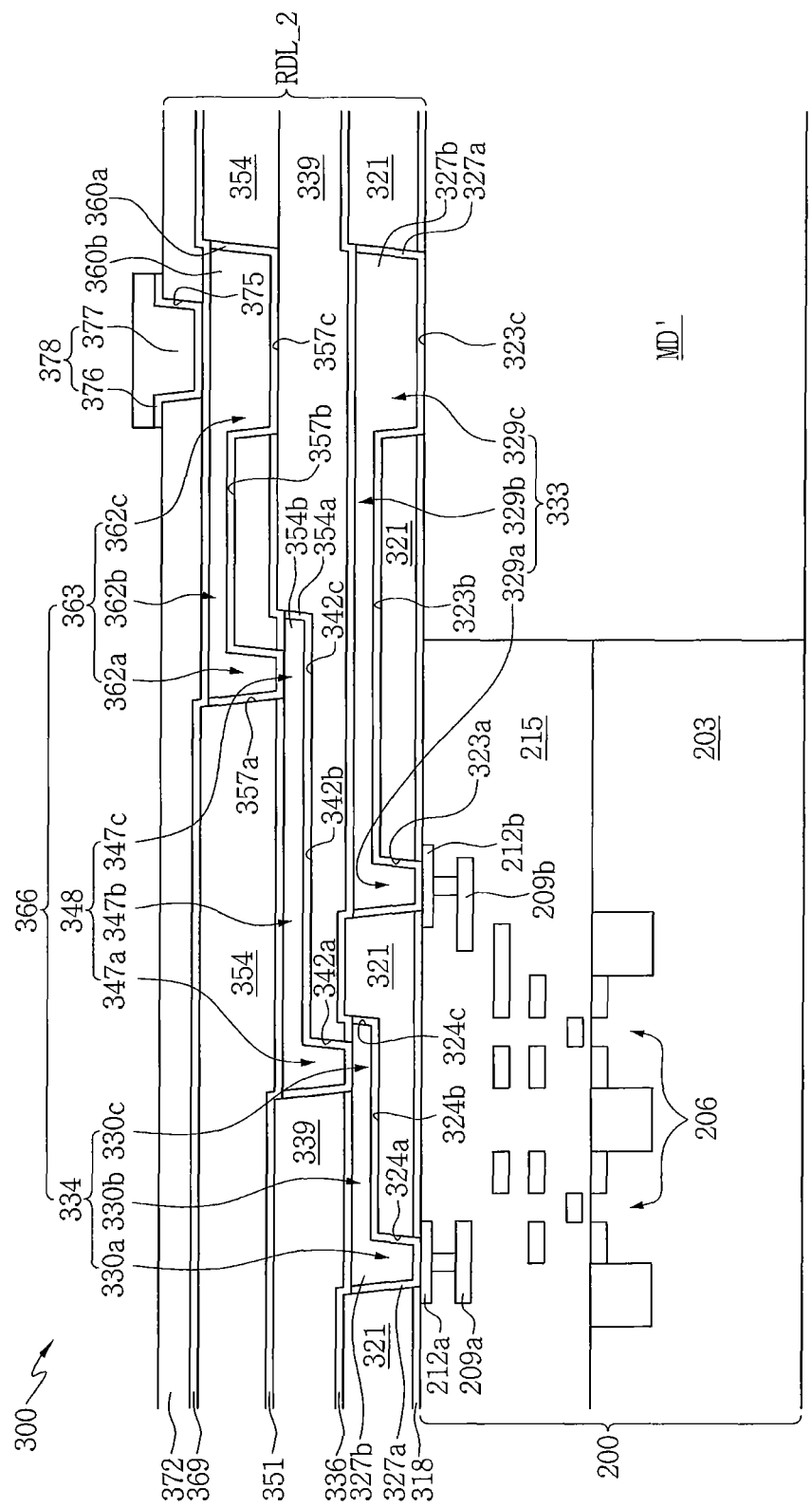
FIG. 5 is a cross-sectional view illustrating an example of an electronic device in accordance with an embodiment of the inventive concept.

FIG. 5 is a cross-sectional view illustrating an example of an electronic device in accordance with an embodiment of the inventive concept. An example 300 of an electronic device in accordance with an embodiment of the inventive concept will be described with reference to FIG. 5.

Referring to FIG. 5, an electronic device 300 including a semiconductor chip area 200, a molding pattern MD', and a connection pattern 378 may be provided.

The semiconductor chip area 200 may include a semiconductor substrate 203, internal circuits 206 disposed on the semiconductor substrate 203, an internal insulating layer 215 disposed on the internal circuits 206, internal interconnection structures 209a and 209b disposed in the internal insulating layer 215, and a first internal pad 212a and a second internal pad 212b, which are electrically connected to the internal interconnection structures 209a and 209b, respectively.

The molding pattern MD' may be disposed on lateral surfaces of the semiconductor chip area 200. In an embodiment, the molding pattern MD' may be disposed to surround the lateral surfaces of the semiconductor chip area 200. The molding pattern MD' may be formed of a molding material such as epoxy or the like.

A redistribution area RDL_2 may include a lower insulating layer 321, an intermediate insulating layer 339, an upper insulating layer 354, and a passivation layer 372, which are sequentially stacked on the semiconductor chip area 200 and the molding pattern MD'. Further, the redistribution area RDL_2 may include an insulating protective layer 318 disposed on surfaces of the semiconductor chip area 200 and the molding pattern MD' and under the lower insulating layer 321, a lower insulating barrier layer 336 disposed between the lower insulating layer 321 and the intermediate insulating layer 339, an intermediate insulating barrier layer 351 disposed between the intermediate insulating layer 339 and the upper insulating layer 354, and an upper insulating barrier layer 369 disposed between the upper insulating layer 354 and the passivation layer 372. Further, the redistribution area RDL_2 may include a first redistribution structure 366 electrically connected to the first internal pad 212a, and a second redistribution structure 333 electrically connected to the second internal pad 212b.

The first redistribution structure 366 may include a lower redistribution structure 334, an intermediate redistribution structure 348 disposed on the lower redistribution structure 334, and an upper redistribution structure 363 disposed on the intermediate redistribution structure 348.

The lower redistribution structure 334 and the second redistribution structure 333 may be disposed in the lower insulating layer 321. The intermediate redistribution structure 348 may be disposed in the intermediate insulating layer 339. The upper redistribution structure 363 may be disposed in the upper insulating layer 354.

The insulating protective layer 318, and the lower, intermediate, and upper insulating barrier layers 336, 351, and 369 may be formed of silicon nitride. The lower, intermediate, and upper insulating layers 321, 339, and 354 may be formed of a photosensitive polymer-based material, for example, a photosensitive polyimide material.

The lower redistribution structure 334 may be formed to have substantially the same structure and/or the same material as the lower redistribution structure 21 described in FIG. 1. The lower redistribution structure 334 may include a first lower contact portion 330a disposed in a first lower contact opening 324a passing through the lower insulating layer 321, a first lower pad portion 330c disposed in a first lower pad recess 324c of the lower insulating layer 321, and a first lower line portion 330b disposed in a first lower line recess 324b of the lower insulating layer 321.

The second redistribution structure 333 may have substantially the same structure and shape as the upper redistribution structure 33 described in FIG. 1. The second redistribution structure 333 may include a second contact portion 329a disposed in a second lower contact opening 323a passing through the lower insulating layer 321, a second pad portion 329c disposed in a second lower pad opening 323c of the lower insulating layer 321, and a second line portion 329b disposed in a second lower line recess 323b of the lower insulating layer 321. In the second redistribution structure 333, the second pad portion 329c may have a greater vertical thickness than the second line portion 329b. The second pad portion 329c of the second redistribution structure 333 may have a greater vertical thickness than the first lower line portion 330b and the first lower pad portion 330c of the lower redistribution structure 334.

Each of the lower redistribution structure 334 and the second redistribution structure 333 may include a second conductive material layer 327b and a first conductive material layer 327a, which covers a lower surface and lateral surfaces of the second conductive material layer 327b.

The intermediate insulating layer 339 and the intermediate redistribution structure 348 may be formed to have substantially the same structure and/or the same material as the lower insulating layer 15 and the lower redistribution structure 21 described in FIG. 1, respectively. For example, the intermediate redistribution structure 348 may include an intermediate contact portion 347a disposed in an intermediate contact opening 342a passing through the intermediate insulating layer 339, an intermediate pad portion 347c disposed in an intermediate pad recess 342c of the intermediate insulating layer 339, and an intermediate line portion 347b disposed in an intermediate line recess 342b of the intermediate insulating layer 339. The intermediate redistribution structure 348 may include a second conductive material layer 354b and a first conductive material layer 354a which covers a lower surface and lateral surfaces of the second conductive material layer 354b.

The upper insulating layer 354 and the upper redistribution structure 363 may be formed to have substantially the same structure and/or the same material as the upper insulating layer 27 and the upper redistribution structure 33 described in FIG. 1, respectively. For example, the upper redistribution structure 363 may include an upper contact portion 362a disposed in an upper contact opening 357a passing through the upper insulating layer 354, an upper pad portion 362c disposed in an upper pad opening 357c passing through the upper insulating layer 354, and an upper line portion 362b disposed in an upper line recess 357b of the upper insulating layer 354. The upper redistribution structure 363 may include a second conductive material layer 360b and a first conductive material layer 360a, which covers a lower surface and lateral surfaces of the second conductive material layer 360b.

The connection pattern 378 may protrude from the passivation layer 372 while disposed in the upper opening 375 passing through the passivation layer 372 and the upper insulating barrier layer 369. In an embodiment, the connection pattern 378 may include a first connection conductive material layer 376 and a second connection conductive material layer 377 disposed on the first connection conductive material layer 376.

Similar to the redistribution area RDL_1 described in FIG. 1, because a photolithography process for forming the redistribution area RDL_2 may be simplified, production costs may be reduced, and because the first redistribution structure 366 is formed to have an embedded structure, defects such as undercuts or the like may be prevented from being generated or the likelihood of their generation reduced. Further, in the redistribution area RDL_2, because the second pad portion 329c and the upper pad portion 362c may be formed to have large thicknesses, defects such as cracks or the like due to stress may be prevented from being generated on the second pad portion 329c and the upper pad portion 362c.

Figure 6A:
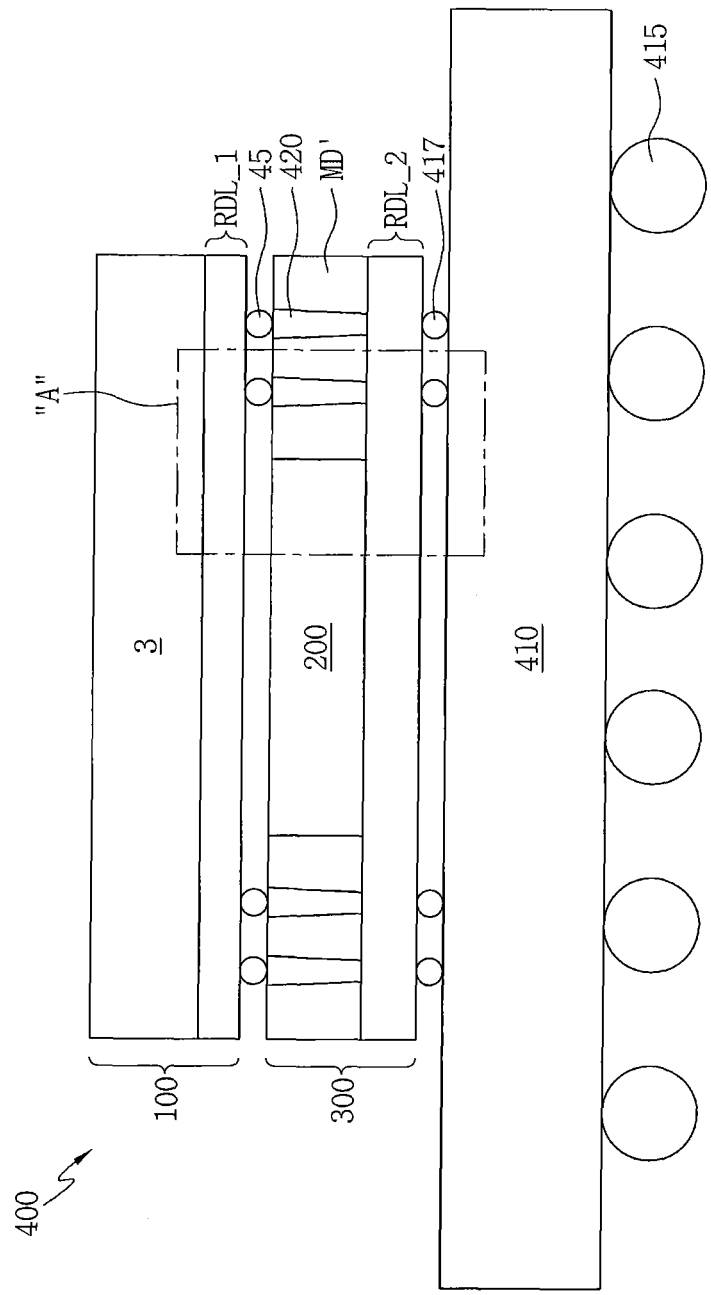

FIGS. 6A and 6B are cross-sectional views illustrating an example of an electronic device in accordance with an embodiment of the inventive concept. FIG. 6B is a partially enlarged view of a part A of FIG. 6A. An example 400 of an electronic device in accordance with an embodiment of the inventive concept will be described with reference to FIGS. 6A and 6B.

Referring to FIGS. 6A and 6B, an electronic device 400 including a first electronic device 300 mounted on a base substrate 410 and a second electronic device 100 mounted on the first electronic device 300 may be provided. The base substrate 410 may be a printed circuit board. The electronic device 400 may be a semiconductor package.

In an embodiment, the first electronic device 300 may be the electronic device described in FIG. 5.

In an embodiment, the second electronic device 100 may be the electronic device described in FIG. 1, for example, a semiconductor device.

First ball structures 415 may be disposed on a back surface of the base substrate 410. Second ball structures 417 may be disposed on a front surface of the base substrate 410.

A redistribution area RDL_2 of the first electronic device 300 may face the front surface of the base substrate 410.

A connection pattern 378 of the redistribution area RDL_2 of the first electronic device 300 may be electrically connected to a pad 413 of the base substrate 410.

The connection pattern 378 of the first electronic device 300 and the pad 413 of the base substrate 410 may be physically and/or electrically connected by a second ball structure 417.

A redistribution area RDL_1 of the second electronic device 100 may be disposed toward the first electronic device 300 or to face the first electronic device 300.

A connection pattern 45 disposed on the redistribution area RDL_1 of the second electronic device 100 may be physically and/or electrically connected to a through conductive structure 420 passing through a molding pattern MD' of the first electronic device 300. The through conductive structure 420 may include a solder material.

The through conductive structure 420 may be electrically connected to a pad portion 329c of a lower redistribution structure 333 of the redistribution area RDL_2 of the first electronic device 300.

Figure 7:
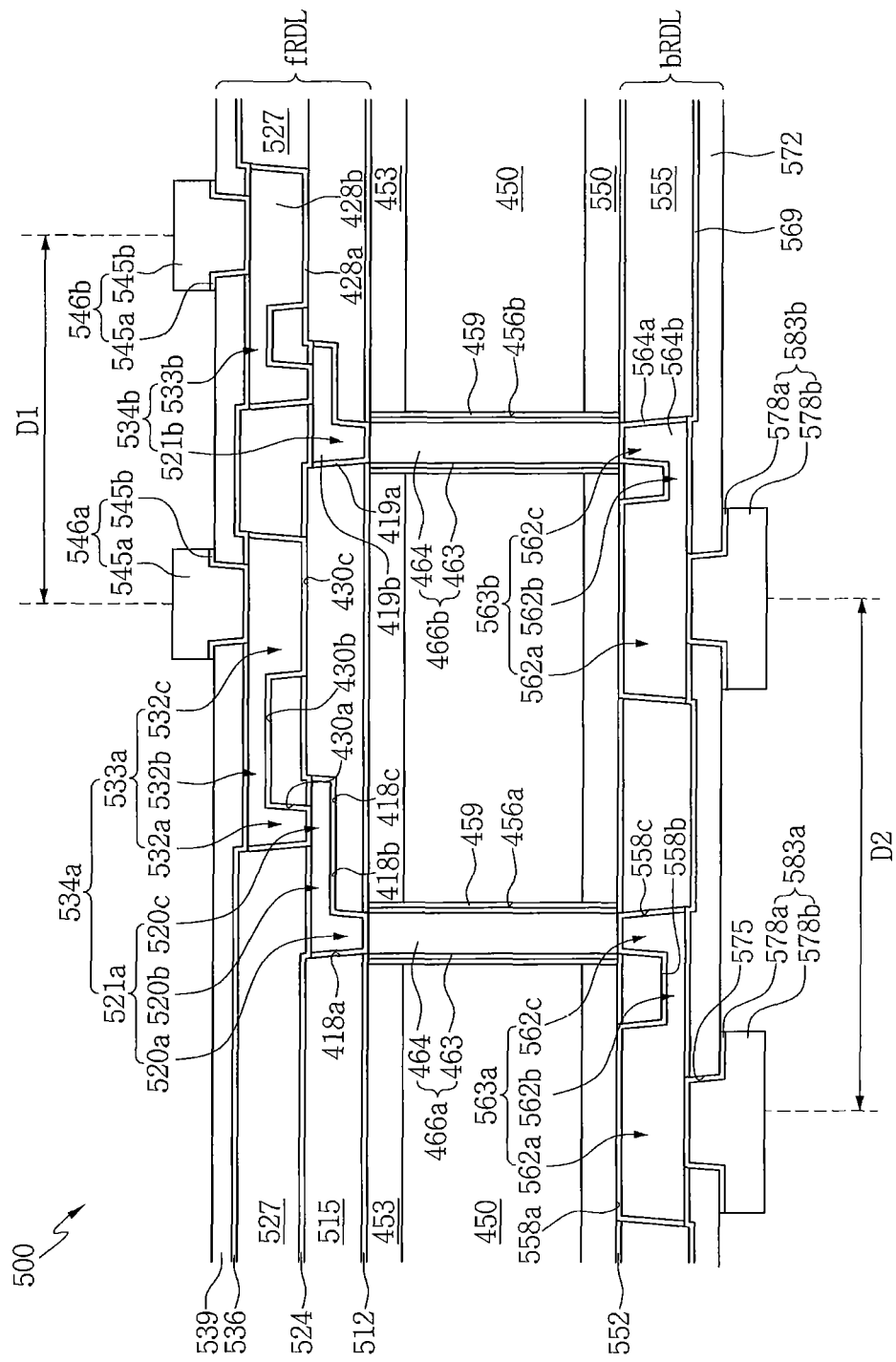
FIG. 7 is a cross-sectional view illustrating an example of an electronic device in accordance with an embodiment of the inventive concept.

FIG. 7 is a cross-sectional view illustrating an example of an electronic device in accordance with an embodiment of the inventive concept. An example 500 of an electronic device in accordance with an embodiment of the inventive concept will be described with reference to FIG. 7.

Referring to FIG. 7, an electronic device 500 including a substrate 450, a front protective layer 453, a back protective layer 550, first and second through via structures 466a and 466b, a front redistribution area fRDL, a back redistribution area bRDL, first and second front connection patterns 546a and 546b, and first and second back connection patterns 583a and 583b may be provided. The electronic device 500 may be an interposer.

The substrate 450 may be disposed between the front redistribution area fRDL and the back redistribution area bRDL. The substrate 450 may be a silicon substrate. However, the inventive concept is not limited thereto. For example, the substrate 450 may be a glass substrate.

The front protective layer 453 may be disposed between the substrate 450 and the front redistribution area fRDL. The back protective layer 550 may be disposed between the substrate 450 and the back redistribution area bRDL.

The first and second through via structures 466a and 466b may be disposed in via holes 456a and 456b, respectively, passing through the substrate 450, the front protective layer 453, and the back protective layer 550. Each of the first and second through via structures 466a and 466b may include a first conductive material layer 463 and a second conductive material layer 464. The first conductive material layer 463 may be disposed on lateral surfaces of the second conductive material layer 464. A buffer insulating layer 459 for insulating the first and second through via structures 466a and 466b from the substrate 450 may be disposed on lateral surfaces of the first and second through via structures 466a and 466b.

The front redistribution area fRDL may include a front lower insulating layer 515, a front upper insulating layer 527, and a front passivation layer 539, which are sequentially stacked on the front protective layer 453. Further, the front redistribution area fRDL may include a front lower insulating barrier layer 512 disposed between the front protective layer 453 and the front lower insulating layer 515, an intermediate insulating barrier layer 524 disposed between the front lower insulating layer 515 and the front upper insulating layer 527, and an upper insulating barrier layer 536 disposed between the front upper insulating layer 527 and the front passivation layer 539. Further, the front redistribution area fRDL may include a first front redistribution structure 534a and a second front redistribution structure 534b.

The first front redistribution structure 534a may be electrically connected to the first through via structure 466a. The second front redistribution structure 534b may be electrically connected to the second through via structure 466b.

The first front redistribution structure 534a may include a first front lower redistribution structure 521a and a first front upper redistribution structure 533a. The second front redistribution structure 534b may include a second front lower redistribution structure 521b and a second front upper redistribution structure 533b.

The front lower insulating layer 515 may be formed of a photosensitive polyimide material, and the first and second front lower redistribution structures 521a and 521b may be disposed in the front lower insulating layer 515. Each of the first and second front lower redistribution structures 521a and 521b may include a front lower contact portion 520a, a front lower pad portion 520c, and a front lower line portion 520b, like the lower redistribution structure 21 in FIG. 1. The front lower contact portion 520a, the front lower pad portion 520c, and the front lower line portion 520b may be formed to have a structure and/or a shape corresponding to the lower contact portion 20a, the lower pad portion 20c, and the lower line portion 20b, respectively, described in FIG. 1. Each of the first and second front lower redistribution structures 521a and 521b may include a second conductive material layer 419b and a first conductive material layer 419a, which covers a lower surface and lateral surfaces of the second conductive material layer 419b.

The front upper insulating layer 527 may be formed of a photosensitive polyimide material, and the first and second front upper redistribution structures 533a and 533b may be embedded in the front upper insulating layer 527. Each of the first and second front upper redistribution structures 533a and 533b may include a front upper contact portion 532a, a front upper pad portion 532c, and a front upper line portion 532b, like the upper redistribution structure 33 in FIG. 1. The front upper contact portion 532a, the front upper pad portion 532c, and the front upper line portion 532b may be formed to have a structure and/or a shape corresponding to the upper contact portion 32a, the upper pad portion 32c, and the upper line portion 32b described in FIG. 1. Each of the first and second front upper redistribution structures 533a and 533b may include a second conductive material layer 428b and a first conductive material layer 428a, which covers a lower surface and lateral surfaces of the second conductive material layer 428b.

The back redistribution area bRDL may include a back passivation layer 572 and a back insulating layer 555 disposed between the back passivation layer 572 and the back protective layer 550. Further, the back redistribution area bRDL may include a first back insulating barrier layer 569 disposed between the back insulating layer 555 and the back passivation layer 572 and a second back insulating barrier layer 552 disposed between the back insulating layer 555 and the back protective layer 550. The first and second back insulating barrier layers 569 and 552 may be formed of an insulating material, such as silicon nitride or the like. Further, the back redistribution area bRDL may include first and second back redistribution structures 563a and 563b disposed in the back insulating layer 555. The first back redistribution structure 563a may be electrically connected to the first front lower redistribution structure 521a through via structure 466a and the second back redistribution structure 563b may be electrically connected to the second front lower redistribution structure 521b through via structure 466b.

Each of the first and second back redistribution structures 563*a* and 563*b* may include a back contact portion 562*a*, a back pad portion 562*c*, and a back line portion 562*b*, like the upper redistribution structure 33 in FIG. 1. The back contact portion 562*a*, the back pad portion 562*c*, and the back line portion 562*b* may be formed to have a structure and/or a shape corresponding to the upper contact portion 32*a*, the upper pad portion 32*c*, and the upper line portion 32*c* described in FIG. 1.

The first and second front connection patterns 546*a* and 546*b* may pass through the front passivation layer 539 and the first front barrier layer 536 and may be electrically connected to the first and second front redistribution structures 534*a* and 534*b*, respectively. For example, the first front connection pattern 546*a* may be electrically connected to the front upper pad portion 532*c* of the first front redistribution structure 534*a*, and the second front connection pattern 546*b* may be electrically connected to the second front upper redistribution structure 533*b* of the second front redistribution structure 534*b*. Each of the first and second front connection patterns 546*a* and 546*b* may include a first conductive material layer 545*a* and a second conductive material layer 545*b* disposed on the first conductive material layer 545*a*.

The first and second back connection patterns 583*a* and 583*b* may pass through the back passivation layer 572 and the first back barrier layer 569 and may be electrically connected to the first and second back redistribution structures 563*a* and 563*b*, respectively. For example, the first back connection pattern 583*a* may be electrically connected to the back pad portion 562*c* of the first back redistribution structure 563*a*, and the second back connection pattern 583*b* may be electrically connected to the back pad portion 562*c* of the second back redistribution structure 563*b*.

Each of the first and second back connection patterns 583*a* and 583*b* may include a first conductive material layer 578*a* and a second conductive material layer 578*b* disposed on the first conductive material layer 578*a*.

In an embodiment, a distance D2 between the first and second back connection patterns 583*a* and 583*b* may be greater than a distance D1 between the first and second front connection patterns 546*a* and 546*b*.

The front lower insulating layer 515, the front upper insulating layer 527, and the back insulating layer 555 may be formed of a photosensitive polyimide material, and each of the front lower insulating layer 515, the front upper insulating layer 527, and the back insulating layer 555 may be patterned using a photomask including parts having different light transmittances. Therefore, because the front redistribution area fRDL and the back redistribution area bRDL may simplify a photolithography process for forming the redistribution area RDL_2, like the redistribution area RDL_1 described in FIG. 1, production costs can be reduced.

Further, because the redistribution structures 534*a*, 534*b*, 563*a*, and 563*b* may be formed to have an embedded structure, defects such as undercuts or the like may be prevented from being generated or the likelihood of their generation reduced.

Further, in the front redistribution area fRDL and the back redistribution area bRDL, because the front upper pad portion 532*c* and the back pad portion 562*c* may be formed to have large thicknesses, defects such as cracks or the like may be prevented from being generated or the likelihood of their generation reduced on the front upper pad portion 532*c* and the back pad portion 562*c*.

Figure 8A:
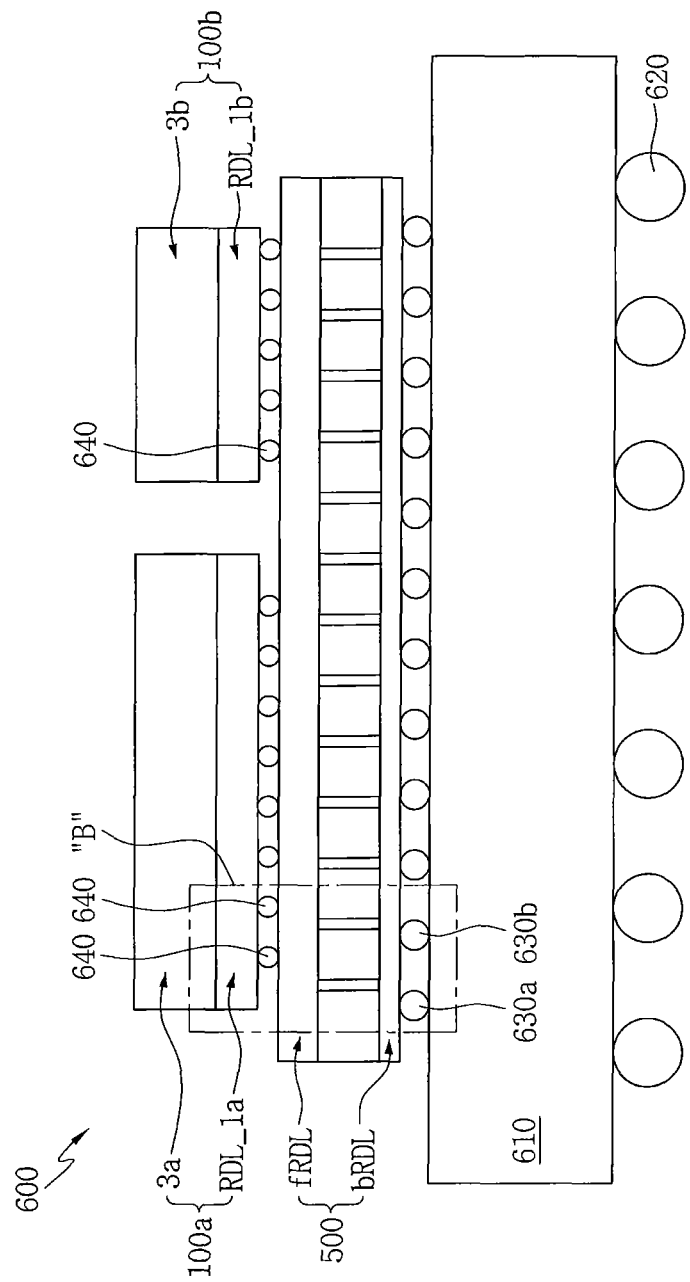
FIG. 8A is a cross-sectional view illustrating an example of an electronic device in accordance with an embodiment of the inventive concept and FIG. 8B is a cross-sectional view illustrating a part of FIG. 8A.
Figure 8B:
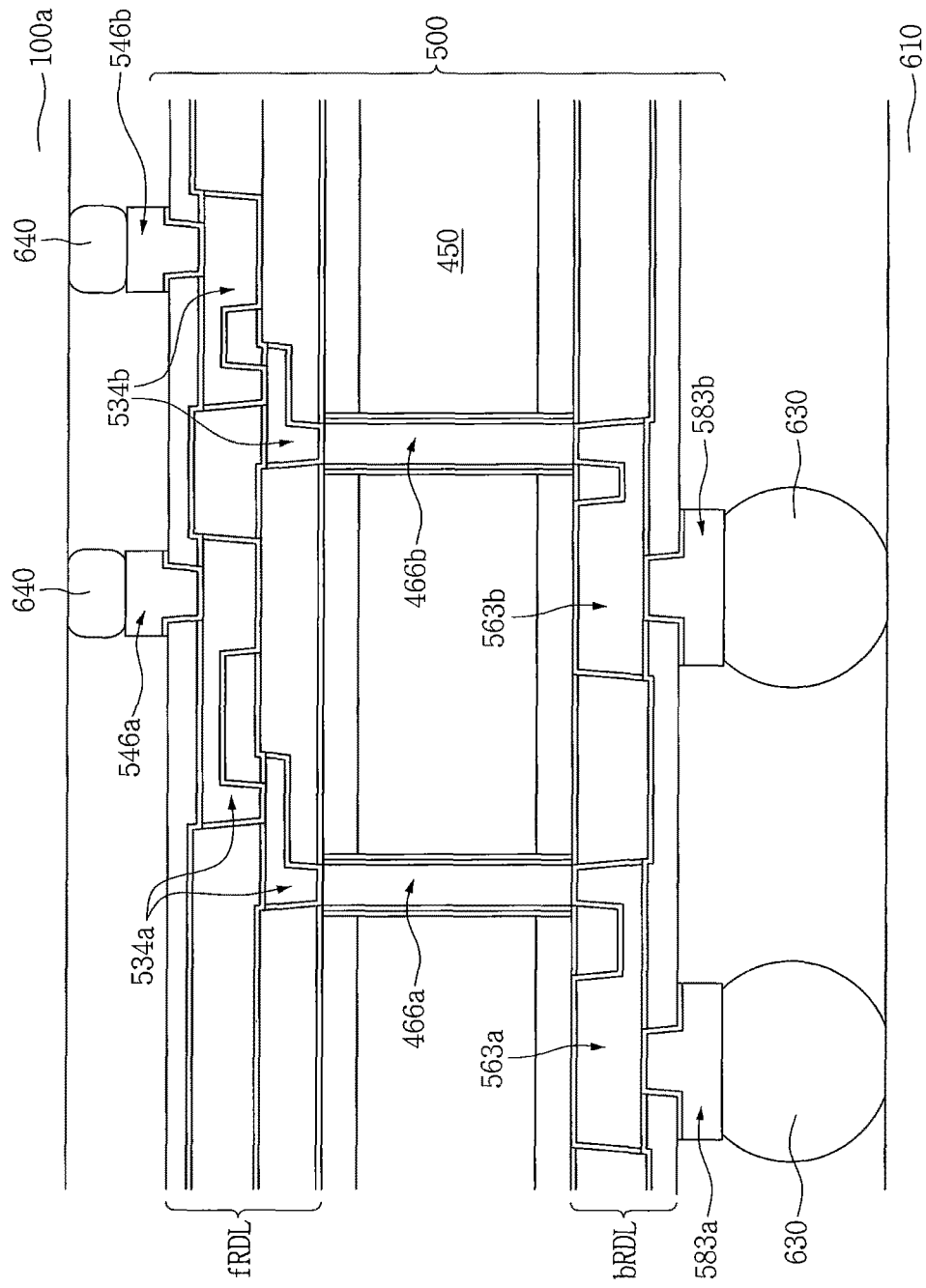

FIG. 8A is a cross-sectional view illustrating an example of an electronic device in accordance with an embodiment of the inventive concept. FIG. 8B is a partially enlarged view of a part B of FIG. 8A. An example 600 of an electronic device in accordance with an embodiment of the inventive concept will be described with reference to FIGS. 8A and 8B.

Referring to FIGS. 8A and 8B, an electronic device 600 including an interposer mounted on a base substrate 610, and first and second semiconductor devices 100*a* and 100*b*, which may be mounted on the interposer may be provided. The electronic device 600 may be a semiconductor package. The base substrate 610 may be a printed circuit substrate or board. The interposer may be the same as the electronic device 500 described in FIG. 7. Therefore, because the interposer 500 may be understood as the electronic device 500 described in FIG. 7, detailed descriptions for the interposer 500 will be omitted here.

The back redistribution area bRDL of the interposer 500 may face the base substrate 610. Base ball structures 620, which may be formed of a solder material, may be disposed under the base substrate 610. The first and second semiconductor devices 100*a* and 100*b* may be mounted on the interposer 500 and may face the front redistribution area fRDL of the interposer 500.

The first semiconductor device 100*a* may include a first redistribution area RDL_1*a* disposed on a first substrate 3*a* and facing the interposer 500, and the second semiconductor device 100*b* may include a second redistribution area RDL_1*b* disposed on a second substrate 3*b* and facing the interposer 500.

The first redistribution area RDL_1*a* of the first semiconductor device 100*a* and/or the second redistribution area RDL_1*b* of the second semiconductor device 100*b* may have substantially the same structure as the redistribution area RDL_1 of the electronic device 100 described in FIG. 1. Therefore, because the first redistribution area RDL_1*a* and the second redistribution area RDL_1*b* have substantially the same structure as the redistribution area RDL_1 in FIG. 1, detailed descriptions will be omitted here.

Upper ball structures 640 may be disposed to physically and/or electrically connect the front connection patterns 546*a* and 546*b* of the interposer 500 to the first and second semiconductor devices 100*a* and 100*b*. Lower ball structures 630 may be disposed to physically and/or electrically connect the back connection patterns 583*a* and 583*b* of the interposer 500 to the base substrate 610. The upper and lower ball structures 640 and 630 may include a solder material.

Figure 9:
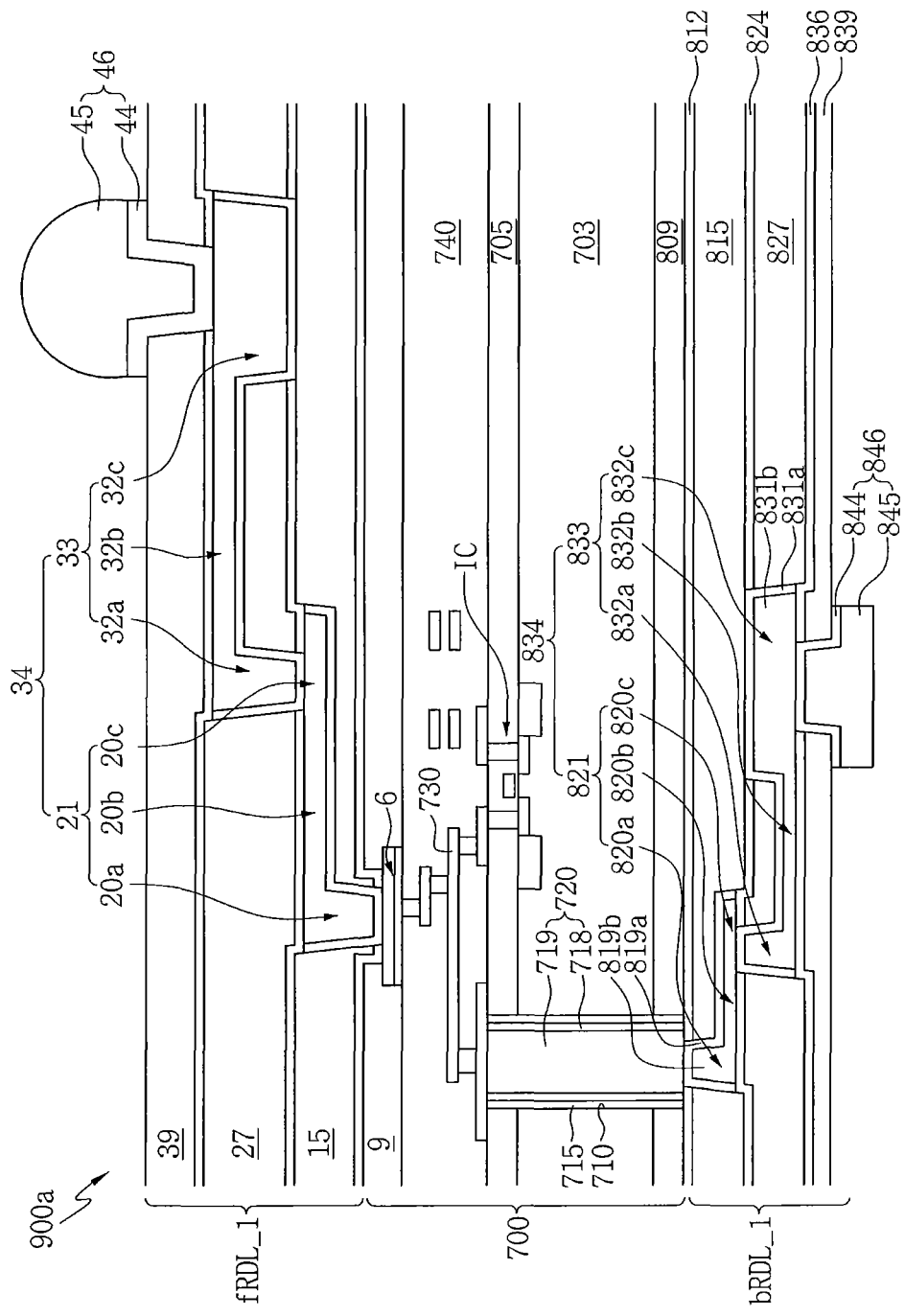
FIG. 9 is a cross-sectional view illustrating an example of an electronic device in accordance with an embodiment of the inventive concept.

FIG. 9 is a cross-sectional view illustrating an example of an electronic device in accordance with an embodiment of the inventive concept. An example 900*a* of an electronic device in accordance with an embodiment of the inventive concept will be described with reference to FIG. 9.

Referring to FIG. 9, an electronic device 900*a* including a front connection pattern 46, a back connection pattern 846, a front redistribution area fRDL_1, a back redistribution area bRDL_1, and a semiconductor device area 700 disposed between the front redistribution area fRDL 1 and the back redistribution area bRDL_1 may be provided.

The semiconductor device area 700 may include a semiconductor substrate 703, a front protective layer 9, a back protective layer 809, internal circuits (ICs), an internal interconnection structure 730, internal insulating layers 705 and 740, an internal pad 6, and a through via structure 720. The back protective layer 809 may be disposed on a back surface of the semiconductor substrate 703. The front protective layer 9, the ICs, the internal interconnection structure 730, the internal insulating layers 705 and 740, and the internal pad 6 may be disposed on a front surface of the semiconductor substrate 703. The internal interconnection structure 730 may be electrically connected to the ICs. The internal insulating layers 705 and 740 may cover the IC and the internal interconnection structure 730. The internal pad 6 may be disposed on the internal insulating layers 705 and 740 and may be electrically connected to the internal interconnection structure 730. The front protective layer 9 may cover upper portions of the internal insulating layers 705 and 740 and may expose an upper surface of the internal pad 6. The through via structure 720 may pass through the semiconductor substrate 703 and the back protective layer 809 and a part 705 of the internal insulating layers 705 and 740. The through via structure 720 may be disposed in a via hole 710 passing through the semiconductor substrate 703 and the back protective layer 809 and the part 705 of the internal insulating layers 705 and 740. To insulate the through via structure 720 from the semiconductor substrate 703, a buffer insulating layer 715 may be disposed between the through via structure 720 and side walls of the via hole 710. The through via structure 720 may include a first conductive material layer 718 and a second conductive material layer 719. The first conductive material layer 718 may be disposed on lateral surfaces of the second conductive material layer 719.

The front redistribution area fRDL_1 may be disposed on the front surface of the semiconductor substrate 703 and the back redistribution area bRDL_1 may be disposed on the back surface of the semiconductor substrate 703. The front redistribution area fRDL_1 may have substantially the same structure as the redistribution area RDL_1 described in FIG. 1. Therefore, the front redistribution area fRDL_1 may include the redistribution structure 34 as described in FIG. 1, and the redistribution structure 34 may be electrically connected to the internal pad 6.

The back redistribution area bRDL_1 may include a back passivation layer 839, a first back insulating layer 815 disposed between the back passivation layer 839 and the back protective layer 809, a first back redistribution structure 821 disposed in the first back insulating layer 815, a second back insulating layer 827 disposed between the first back insulating layer 815 and the back passivation layer 839, and a second back redistribution structure 833 disposed in the second back insulating layer 827. Further, the back redistribution area bRDL_1 may include a first back insulating barrier layer 812 disposed between first back insulating layer 815 and the back protective layer 809, a second back insulating barrier layer 824 disposed between the first back insulating layer 815 and the second back insulating layer 827, and a third back insulating barrier layer 836 disposed between the back passivation layer 839 and the second back insulating layer 827.

The first and second back redistribution structures 821 and 833 may constitute a back redistribution structure 834. The back redistribution structure 834 may have substantially the same structure as the redistribution structure 34 in FIG. 1. The first back redistribution structure 821 may include a first back contact portion 820a, a first back pad portion 820c, and a first back line portion 820b, which may correspond to the lower contact portion 20a, the lower pad portion 20c, and the lower line portion 20b of the lower redistribution structure 21 in FIG. 1, respectively. The second back redistribution structure 833 may include a second back contact portion 832a, a second back pad portion 832c, and a second back line portion 832b, which may correspond to the upper contact portion 32a, the upper pad portion 32c, and the upper line portion 32b of the upper redistribution structure 33 in FIG. 1, respectively.

The first and second back redistribution structures 821 and 833 may include second conductive material layers 819b and 831b, and first conductive material layers 819a and 831a, respectively, which cover surfaces of the second conductive material layers 819b and 831b toward the semiconductor device area 700 and lateral surfaces of the second conductive material layers 819b and 831b.

The first back contact portion 820a of the first back redistribution structure 821 may be physically and/or electrically connected to the through via structure 720. The second back contact portion 832a of the second back redistribution structure 833 may be physically and/or electrically connected to the first back pad portion 820c of the first back redistribution structure 821.

Figure 10:
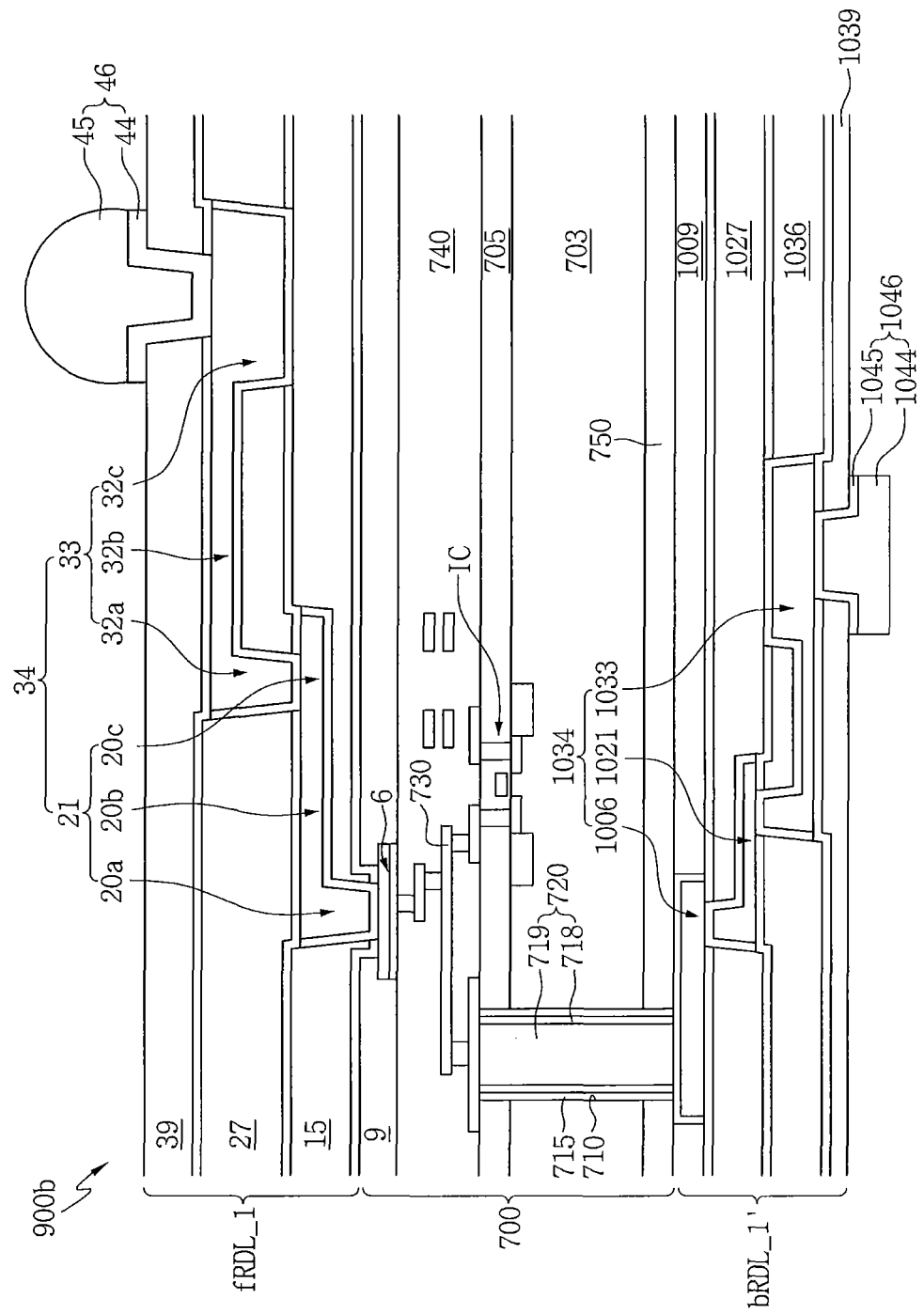
FIG. 10 is a cross-sectional view illustrating an example of an electronic device in accordance with an embodiment of the inventive concept.

FIG. 10 is a cross-sectional view illustrating an example of an electronic device in accordance with an embodiment of the inventive concept. An example 900b of an electronic device in accordance with an embodiment of the inventive concept will be described with reference to FIG. 10.

Referring to FIG. 10, an electronic device 900b including a front connection pattern 46, a back connection pattern 1046, a front redistribution area fRDL_1, a back redistribution area bRDL_1', and a semiconductor device area 700 disposed between the front redistribution area fRDL_1 and the back redistribution area bRDL_1' may be provided. The front connection pattern 46, the back connection pattern 1046, the front redistribution area fRDL_1, and the semiconductor device area 700 may be the same as those described in FIG. 9.

The back redistribution area bRDL_1' may have the same shape and structure as the redistribution area RDL_1' described in FIG. 4.

A third redistribution structure 1006 of the back redistribution area bRDL_1' may be electrically connected to the through via structure 720.

FIGS. 11A to 11E are cross-sectional views illustrating an example of a method of forming an electronic device in accordance with an embodiment of the inventive concept. An example of a method of forming an electronic device in accordance with an embodiment of the inventive concept will be described with reference to FIGS. 11A to 11E.

Referring to FIG. 11A, a conductive pattern 6 may be formed on a substrate 4. The substrate 4 may be a semiconductor substrate or an interposer substrate. The conductive pattern 6 may include a barrier layer 6a and a pad layer 6b disposed on the barrier layer 6a.

A protective layer 9 may be formed on the substrate 4. The protective layer 9 may have an opening 9a, which exposes a part of an upper surface of the conductive pattern 6. The protective layer 9 may be formed of an insulating material, such as silicon nitride, silicon oxide, or the like.

Referring to FIG. 11B, a lower barrier layer 12 and a lower insulating layer 15 may be sequentially formed on the protective layer 9. The lower barrier layer 12 may be formed of an insulating material, such as silicon nitride or the like. The lower insulating layer 15 may be formed of a photosensitive polymer-based material. For example, the lower insulating layer 15 may be formed of a photosensitive polyimide material.

A lower contact opening 18a, a lower pad recess 18c, and a lower line recess 18b may be simultaneously formed by exposing and developing the lower insulating layer 15 by performing a photolithography process using a first photomask 150.

The lower contact opening 18a may pass through the lower insulating layer 15. The lower pad recess 18c and the lower line recess 18b may be formed by partially exposing and developing a part of the lower insulating layer 15.

The first photomask 150 may include parts having different light transmittances. For example, the first photomask 150 may include a transparent first part 156, a semi-transparent second part 154, and an opaque third part 152.

The first photomask 150 may be manufactured using various materials in which a technique that may change a light transmittance of a material is applied. For example, the first photomask 150 may be a gray photomask or a phase shift photomask (PSM).

In the first photomask 150, the first part 156 may be a part corresponding to the lower contact opening 18a, the second part 154 may be a part corresponding to the lower line recess 18b, and the third part 152 may be a part corresponding to the lower pad recess 18c.

Figure 11C:
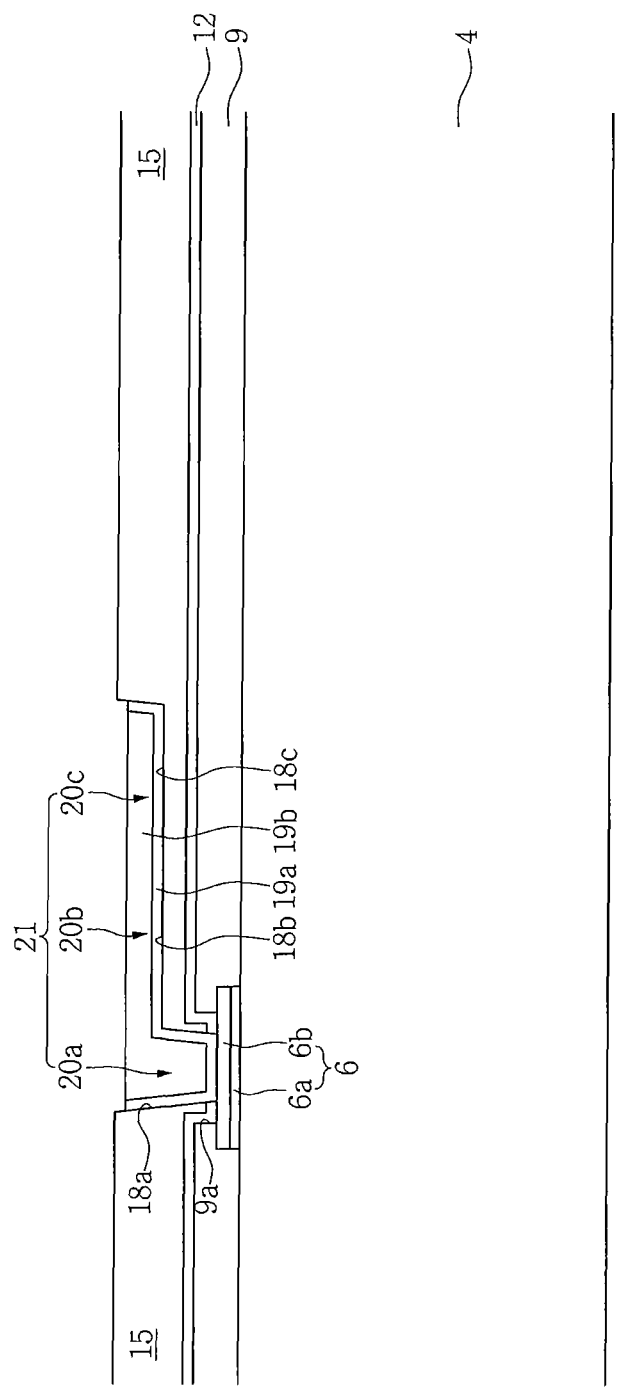

Referring to FIG. 11C, the conductive pattern 6 may be exposed by etching the lower insulating barrier layer 12, which may be exposed by the lower contact opening 18a. Next, a lower redistribution structure 21 may be formed using an electroplating process and an etching process.

The formation of the lower redistribution structure 21 may include forming a conductive material layer, which covers the lower insulating layer 15 and fills the lower contact opening 18a, the lower pad recess 18c, and the lower line recess 18b, planarizing the conductive material layer, and performing a wet etching process on the conductive material layer.

The formation of the lower redistribution structure 21 may include forming a first conductive material layer 20a including a barrier and/or seed layer, forming a second conductive material layer 20b, which may be formed using an electroplating process using the first conductive material layer 20a as a seed, and partially etching the first and second conductive material layers 20a and 20b.

The lower redistribution structure 21 may partially fill the lower contact opening 18a, the lower pad recess 18c, and the lower line recess 18b.

The lower redistribution structure 21 may include the lower contact portion 20a disposed in the lower contact opening 18a, a lower pad portion 20c disposed in the lower pad recess 18c, and the lower line portion 20b disposed in the lower line recess 18b.

Figure 11D:
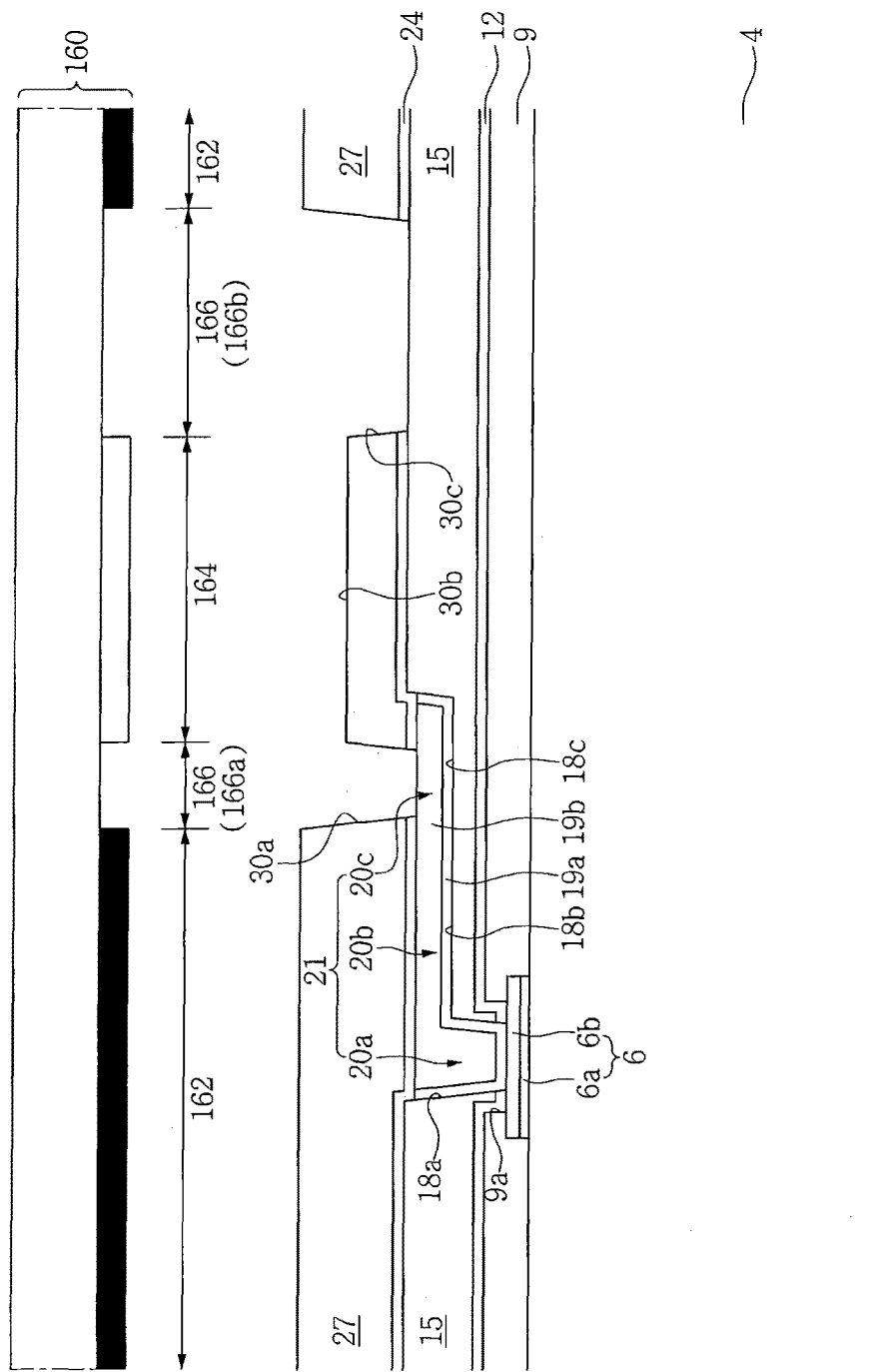

Referring to FIG. 11D, an intermediate insulating barrier layer 24 may be formed to cover the lower redistribution structure 21 and the lower insulating layer 15. The intermediate insulating barrier layer 24 may be formed of silicon nitride. An upper insulating layer 27 may be formed on the intermediate insulating barrier layer 24. The upper insulating layer 27 may be formed of the same material as the lower insulating layer 15, for example, a photosensitive polyimide material.

An upper contact opening 30a, an upper pad opening 30c, and an upper line recess 30b may be formed by exposing and developing the upper insulating layer 27 by performing a photolithography process using a second photomask 160.

The upper contact opening 30a and the upper pad opening 30c may pass through the upper insulating layer 27. The upper line recess 30b may be connected to an upper portion of the upper contact opening 30a and an upper portion of the upper pad opening 30c and may not pass through the upper insulating layer 27.

The second photomask 160 may include a transparent first part 166, a semi-transparent second part 164, and an opaque third part 162. The first part 166 of the second photomask 160 may include a contact portion 166a and a pad portion 166b.

The second photomask 160 may be a gray photomask or a PSM, like the first photomask 150 in FIG. 11B.

In the second photomask 160, the contact portion 166a of the first part 166 may be a part corresponding to the upper contact opening 30a, the second part 164 may be a part corresponding to the upper line recess 30b, and the third part 162 may be a part corresponding to the upper pad opening 30c.

Figure 11E:
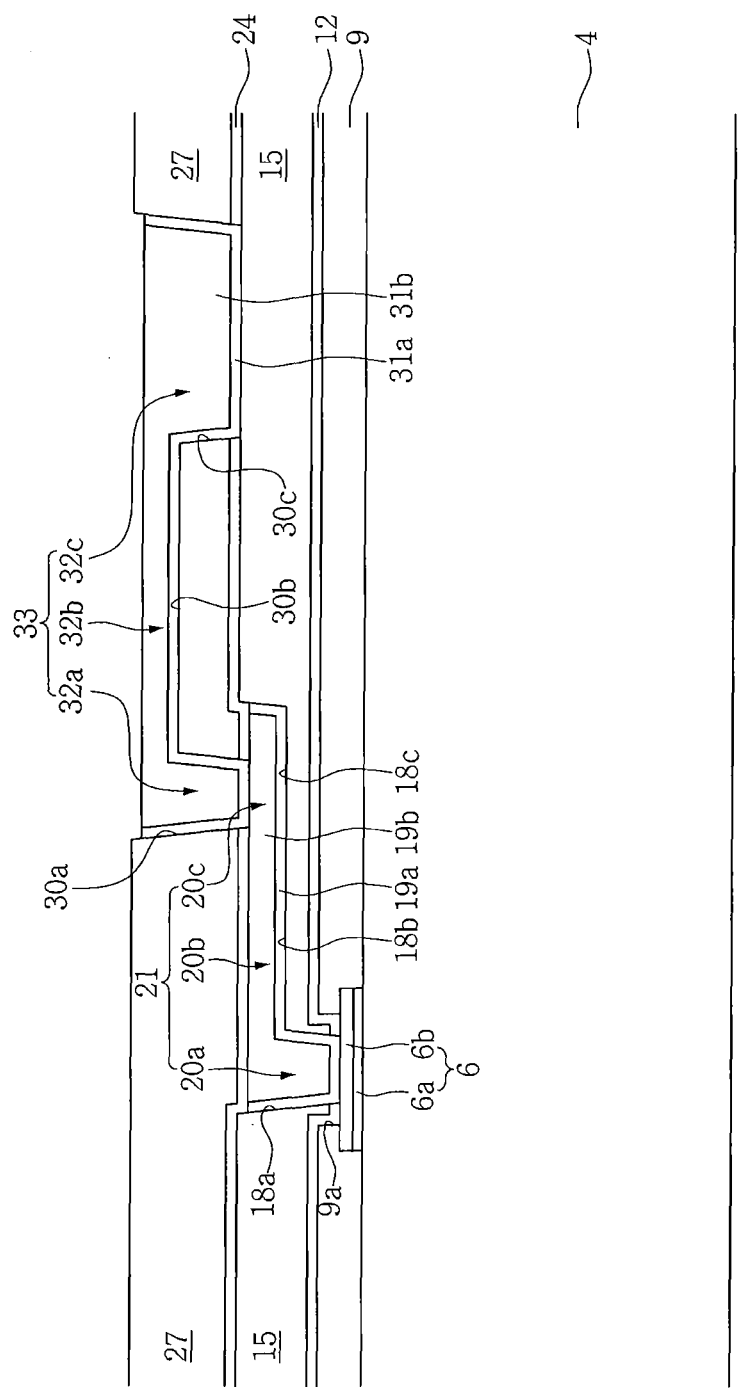

Referring to FIG. 11E, an upper redistribution structure 33 may be formed using substantially the same method as the method of forming the lower redistribution structure 21 described in FIG. 11C.

The upper redistribution structure 33 may include an upper contact portion 32a disposed in the upper contact opening 30a, an upper pad portion 32c disposed in the upper pad opening 30c, and an upper line portion 32b disposed in the upper line recess 30b.

The upper redistribution structure 33 may be formed of the same material as the lower redistribution structure 21 described in FIG. 11C.

The upper redistribution structure 33 may include a first conductive material layer 31a including a barrier and/or seed layer and a second conductive material layer 31b which may be formed using an electroplating process using the first conductive material layer 31a as a seed.

Referring again to FIG. 1, an upper insulating barrier layer 36 may be formed to cover the upper redistribution structure 33 and the upper insulating layer 27. The upper insulating barrier layer 36 may be formed of silicon nitride.

A passivation layer 39 may be formed on the upper insulating barrier layer 36.

In an embodiment, the passivation layer 39 may be formed of a polymer-based insulating material. For example, the passivation layer 39 may be formed of a photosensitive polyimide material. However, the inventive concept is not limited thereto. For example, the passivation layer 39 may be formed of silicon nitride or another insulating material.

An upper opening 42 may be formed to pass through the passivation layer 39 and expose the upper pad portion 32c of the upper redistribution structure 33.

Next, a connection pattern 46 may be formed on the upper pad portion 32c exposed by the upper opening 42.

In an embodiment, the connection pattern 46 may include a lower connection pattern 44 and an upper connection pattern 45 disposed on the lower connection pattern 44. The lower connection pattern 44 may be a conductive bump, and the upper connection pattern 45 may be a solder material or a solder ball.

Figure 12A:
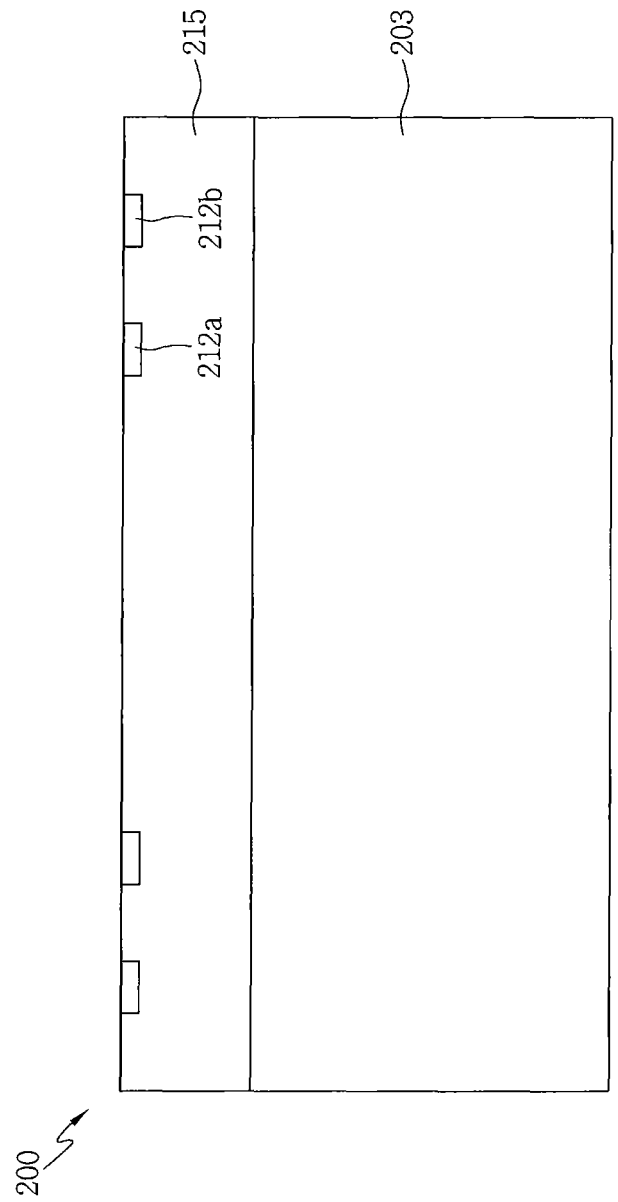
FIGS. 12A to 20 are cross-sectional views illustrating an example of a method of forming an electronic device in accordance with an embodiment of the inventive concept.

FIGS. 12A to 20 are cross-sectional views illustrating an example of a method of forming an electronic device in accordance with an embodiment of the inventive concept. Here, FIG. 12B is a cross-sectional view for describing a part of FIG. 12A, FIG. 15B is a cross-sectional view for describing a part of FIG. 15A, and FIGS. 17A to 17C are cross-sectional views for describing a part of FIG. 16. An example of a method of forming an electronic device in accordance with an embodiment of the inventive concept will be described with reference to FIGS. 12A to 20.

Figure 12B:
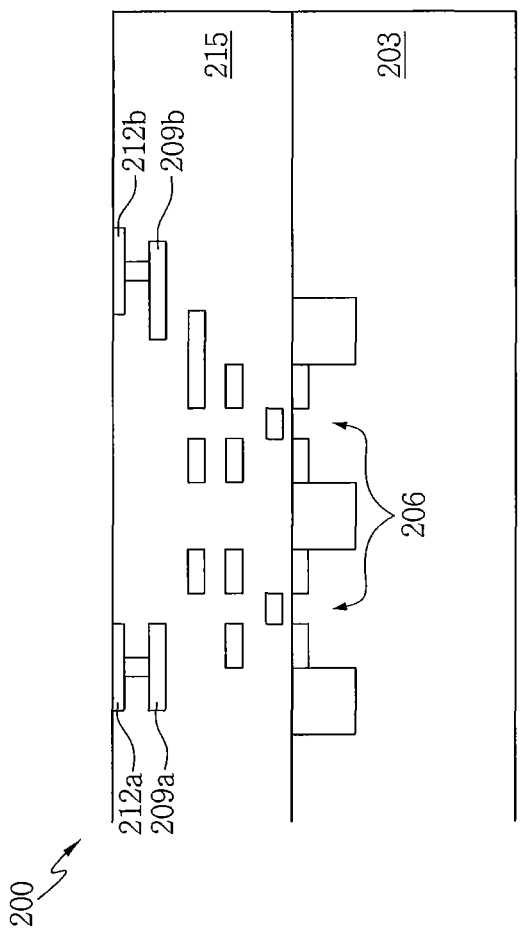

Referring to FIGS. 12A and 12B, a plurality of semiconductor dies or semiconductor chips 200 may be formed by performing a semiconductor process. Each of the plurality of semiconductor chips 200 may include internal circuits 206 formed on a semiconductor substrate 203, internal interconnection structures 209a and 209b, which may be connected to the internal circuits 206, an internal insulating layer 215, and internal pads. The internal pads may include first and second internal pads 212a and 212b.

Figure 13:
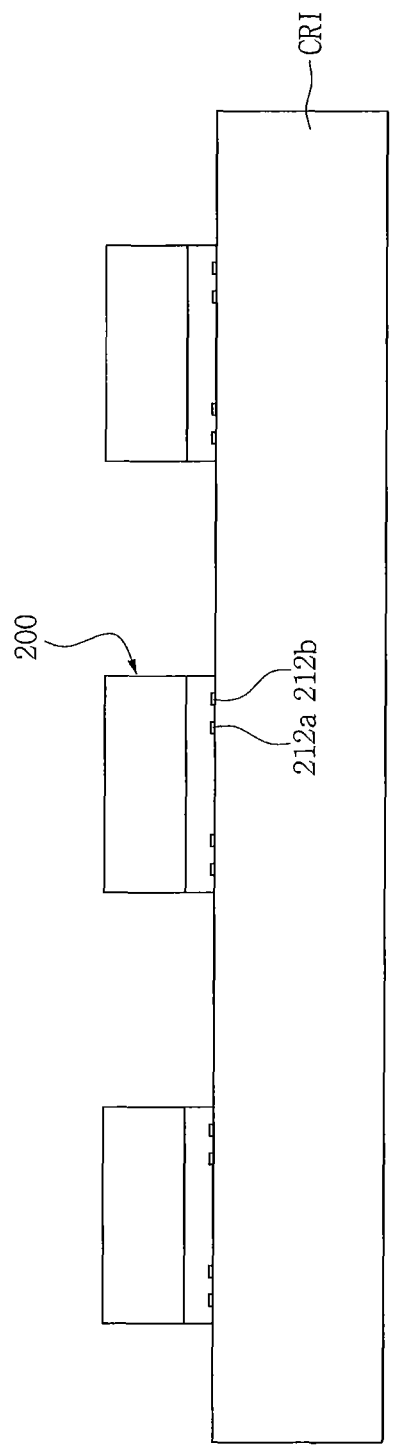

Referring to FIG. 13, the plurality of semiconductor chips 200 may be disposed on a chip carrier CR1. The plurality of semiconductor chips 200 may be spaced apart from each other. In the plurality of semiconductor chips 200, the first and second internal pads 212a and 212b may be disposed toward the chip carrier CR1.

Figure 14:
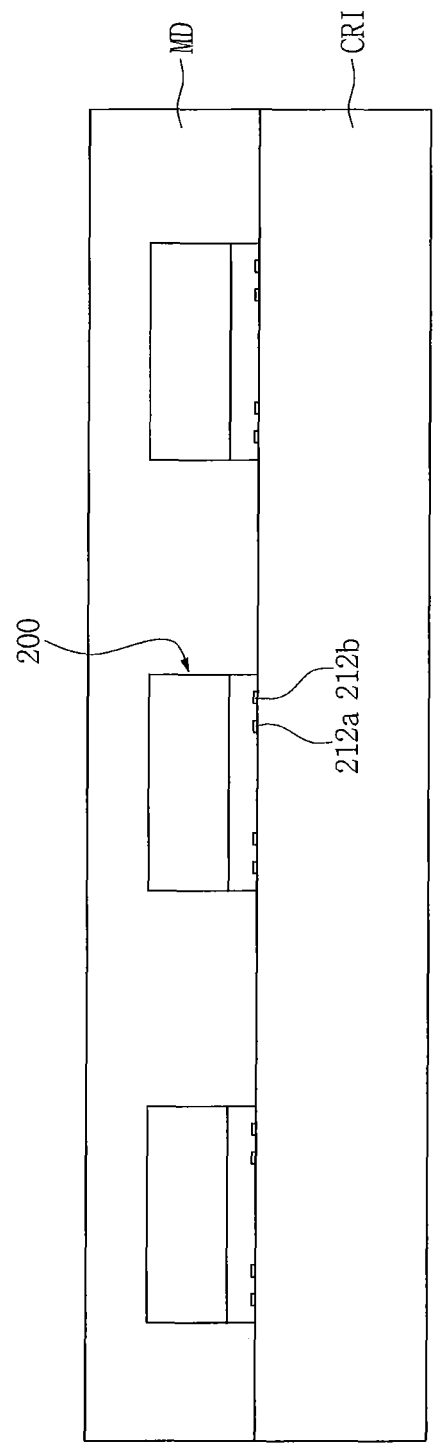

Referring to FIG. 14, a molding layer MD which covers the plurality of semiconductor chips 200 may be formed on the chip carrier CR1. The molding layer MD may be formed of a molding material, such as epoxy or the like.

Figure 15A:
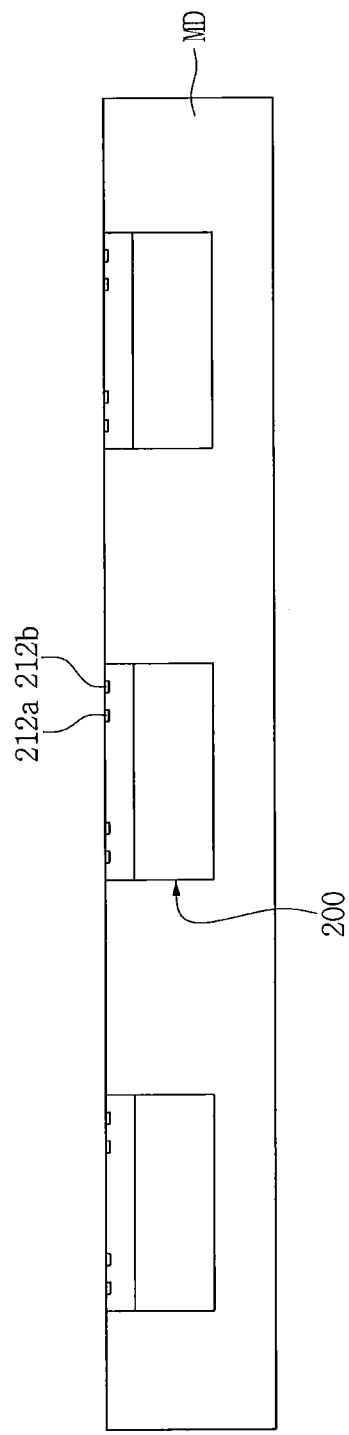
Figure 15B:
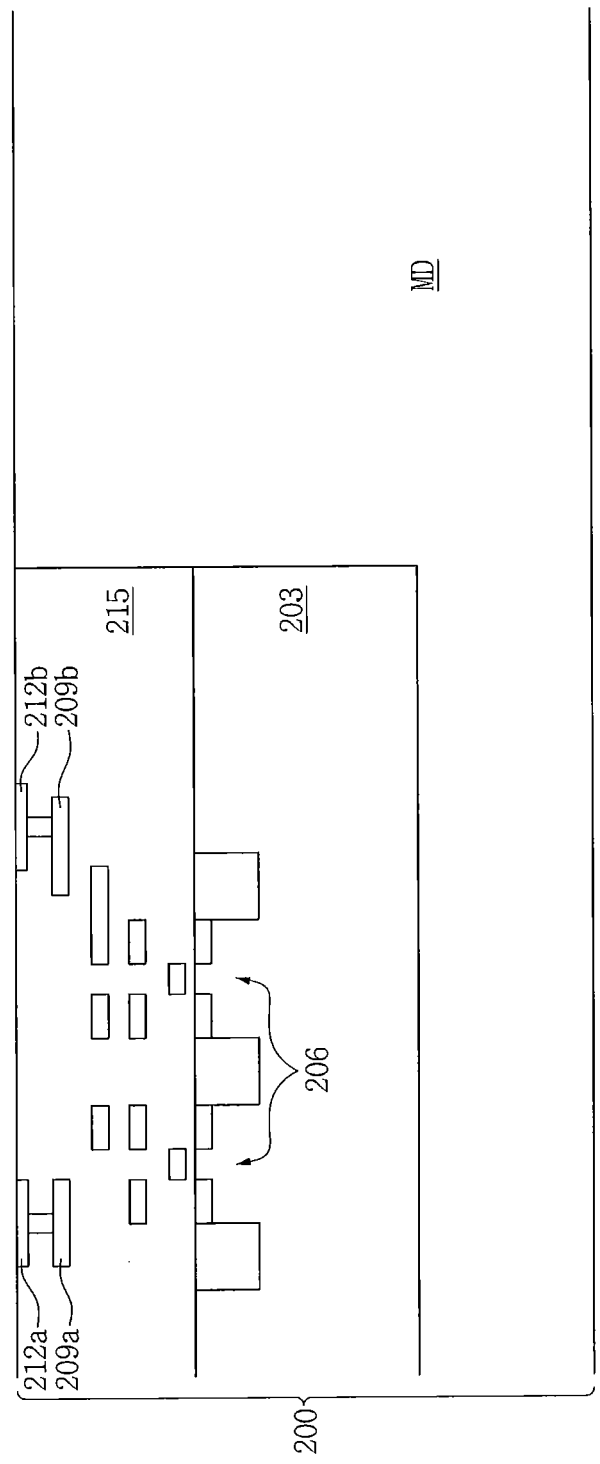

Referring to FIGS. 15A and 15B, the plurality of semiconductor chips 200 may be exposed by separating the chip carrier CR1.

Figure 16:
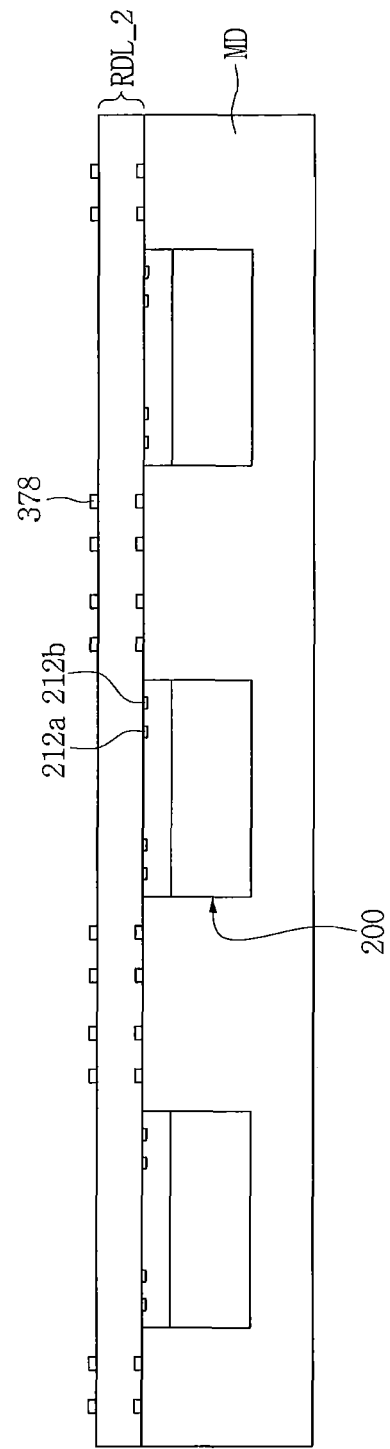

Referring to FIG. 16, a redistribution area RDL_2 and connection patterns 378 may be formed on the plurality of semiconductor chips 200 and the molding layer MD.

An example of a method of forming the redistribution area RDL_2 and the connection patterns 378 will be described with reference to FIGS. 17A to 17C, and 5.

Figure 17A:
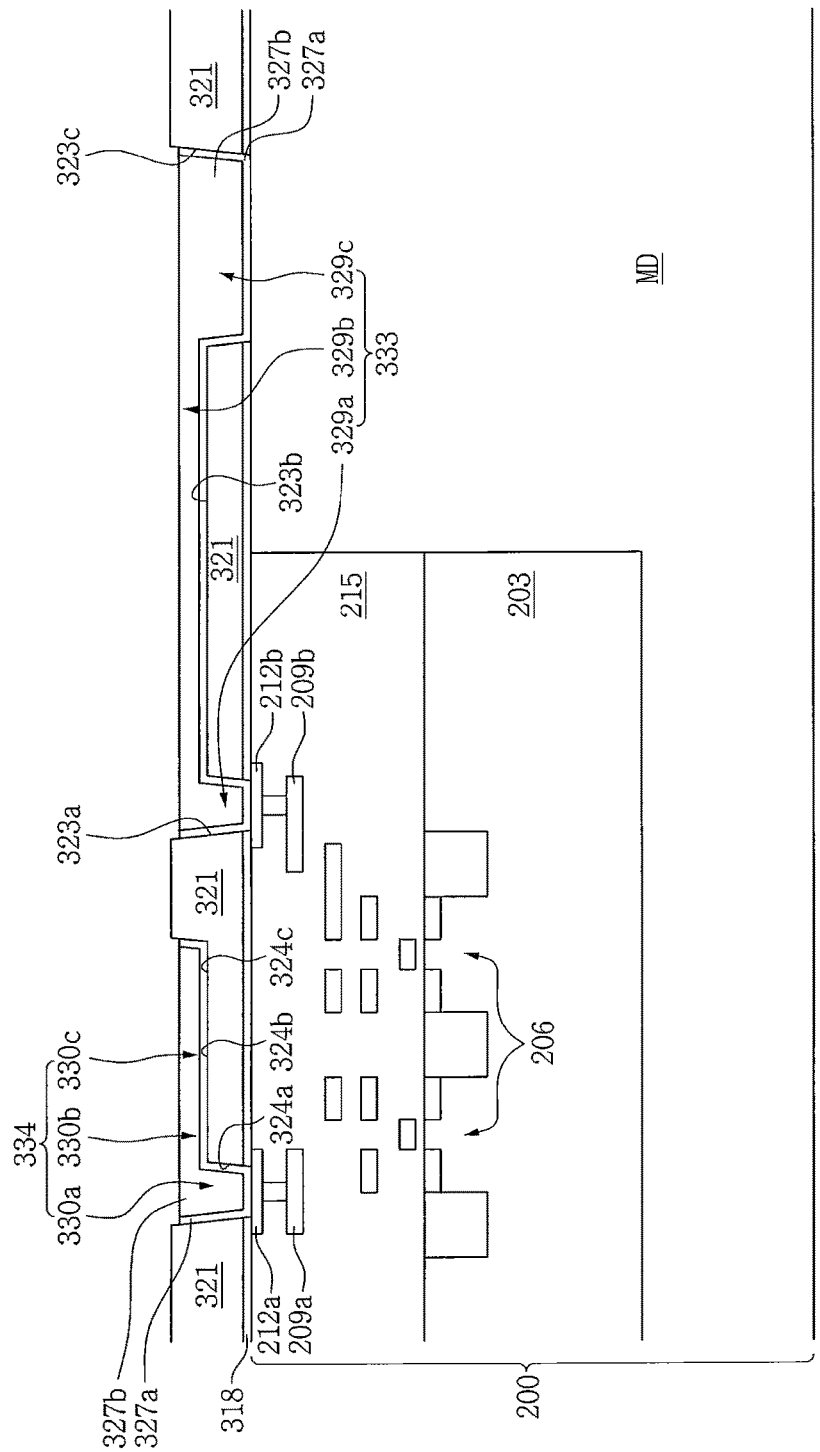

Referring to FIG. 17A, an insulating protective layer 318 may be formed on the plurality of semiconductor chips 200 and the molding layer MD. The insulating protective layer 318 may be formed of an insulating material, such as silicon nitride or the like. A lower insulating layer 321 may be formed on the insulating protective layer 318. The lower insulating layer 321 may be formed of a photosensitive polyimide material.

A first lower contact opening 324a, a first lower line recess 324b, and a first lower pad recess 324c, which are connected to each other in the lower insulating layer 321, may be formed by exposing and developing the lower insulating layer 321 using substantially the same method as the photolithography process described in FIG. 11B, and at the same time, a second lower contact opening 323a, a second lower line recess 323b, and a second lower pad opening 323c, which are connected to each other may be formed. The first lower contact opening 324a, the second lower contact opening 323a, and the second lower pad opening 323c may pass through the lower insulating layer 321. The first lower line recess 324b, the first lower pad recess 324c, and the second lower line recess 323b may not pass through the lower insulating layer 321.

Next, the first internal pad 212a disposed under the first lower contact opening 324a and the second internal pad 212b disposed under the second lower contact opening 323a may be exposed by etching the insulating protective layer 318.

Next, a lower redistribution structure 334 and a second redistribution structure 333 may be formed in the lower insulating layer 321 using substantially the same method as the method of forming the lower redistribution structure 21 described in FIG. 11C.

The lower redistribution structure 334 may include a first lower contact portion 330a disposed in the first lower contact opening 324a passing through the lower insulating layer 321, a first lower pad portion 330c disposed in the first lower pad recess 324c of the lower insulating layer 321, and a first lower line portion 330b disposed in the first lower line recess 324b of the lower insulating layer 321.

The second redistribution structure 333 may include a second contact portion 329a disposed in the second lower contact opening 323a passing through the lower insulating layer 321, a second pad portion 329c disposed in the second lower pad opening 323c of the lower insulating layer 321, and a second line portion 329b disposed in the second lower line recess 323b of the lower insulating layer 321. The lower redistribution structure 334 and the second redistribution structure 333 may be disposed at a lower level than an upper surface of the lower insulating layer 321.

The lower redistribution structure 334 and the second redistribution structure 333 may be formed of the same material as the lower redistribution structure 21 described in FIG. 11C. For example, the lower redistribution structure 334 and the second redistribution structure 333 may include a first conductive material layer 327a including a barrier and/or seed layer and a second conductive material layer 327b which may be formed using an electroplating process using the first conductive material layer 327a as a seed.

Figure 17B:
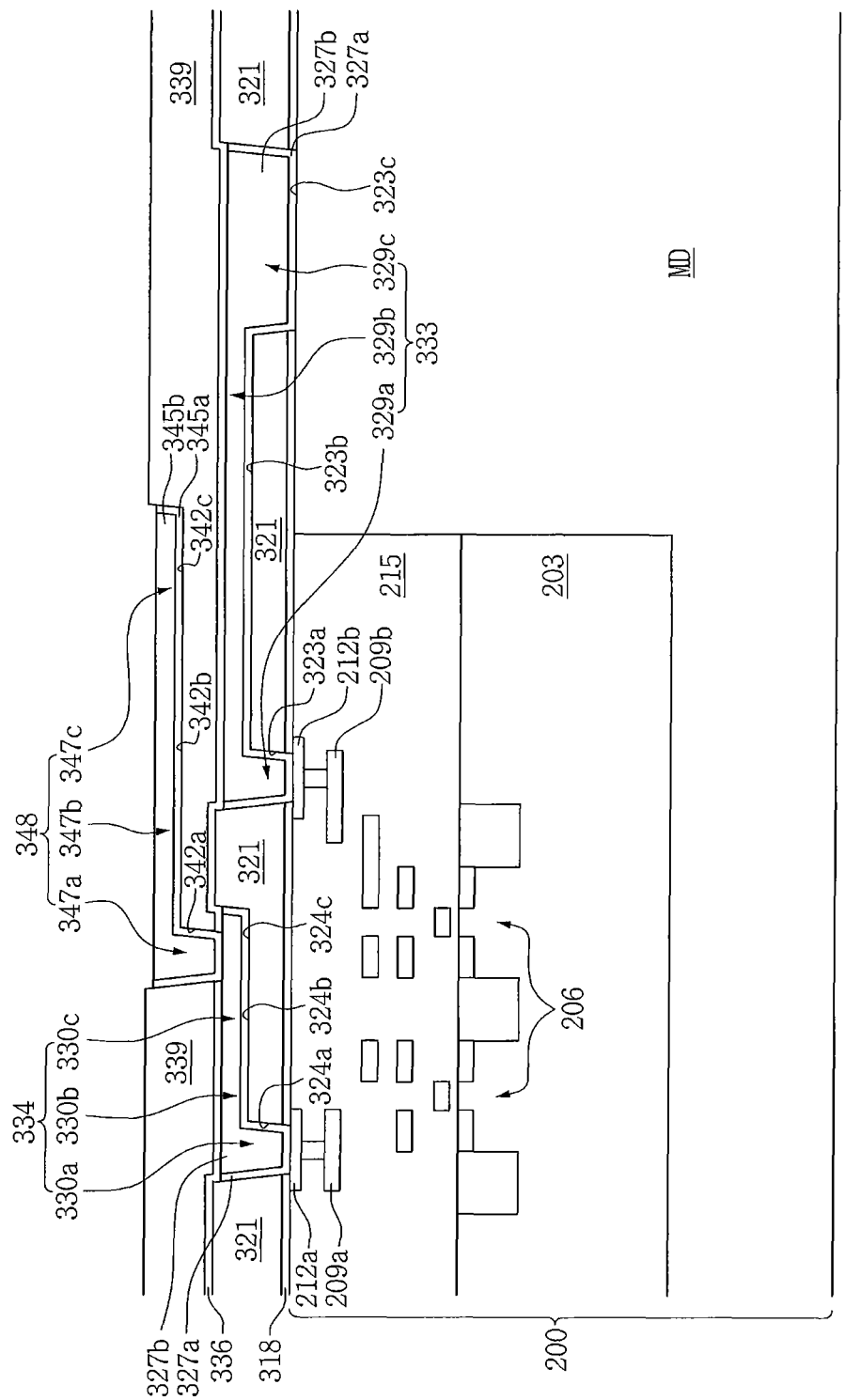

Referring to FIG. 17B, a lower insulating barrier layer 336 may be formed to cover the lower insulating layer 321, the lower redistribution structure 334, and the second redistribution structure 333. The lower insulating barrier layer 336 may be formed of silicon nitride. An intermediate insulating layer 339 may be formed on the lower insulating barrier layer 336. The intermediate insulating layer 339 may be formed of a photosensitive polyimide material.

An intermediate contact opening 342a, an intermediate line recess 342b, and an intermediate pad recess 342c, which are connected to each other in the intermediate insulating layer 339 may be simultaneously formed by exposing and developing the intermediate insulating layer 339 using substantially the same method as the photolithography process described in FIG. 11B. The intermediate contact opening 342a may pass through the intermediate insulating layer 339, and the intermediate line recess 342b and the intermediate pad recess 342c may not pass through the intermediate insulating layer 339.

Next, an intermediate redistribution structure 348 may be formed in the intermediate insulating layer 339 using substantially the same method as the method of forming the lower redistribution structure 21 described in FIG. 11C. An upper surface of the intermediate redistribution structure 348 may be lower than an upper surface of the intermediate insulating layer 339.

The intermediate redistribution structure 348 may include an intermediate contact portion 347a disposed in the intermediate contact opening 342a, an intermediate pad portion 347c disposed in the intermediate pad recess 342c, and an intermediate line portion 347b disposed in the intermediate line recess 342b. The intermediate redistribution structure 348 may include a first conductive material layer 345a including a barrier and/or seed layer and a second conductive material layer 345b, which may be formed using an electroplating process using the first conductive material layer 345a as a seed.

Figure 17C:
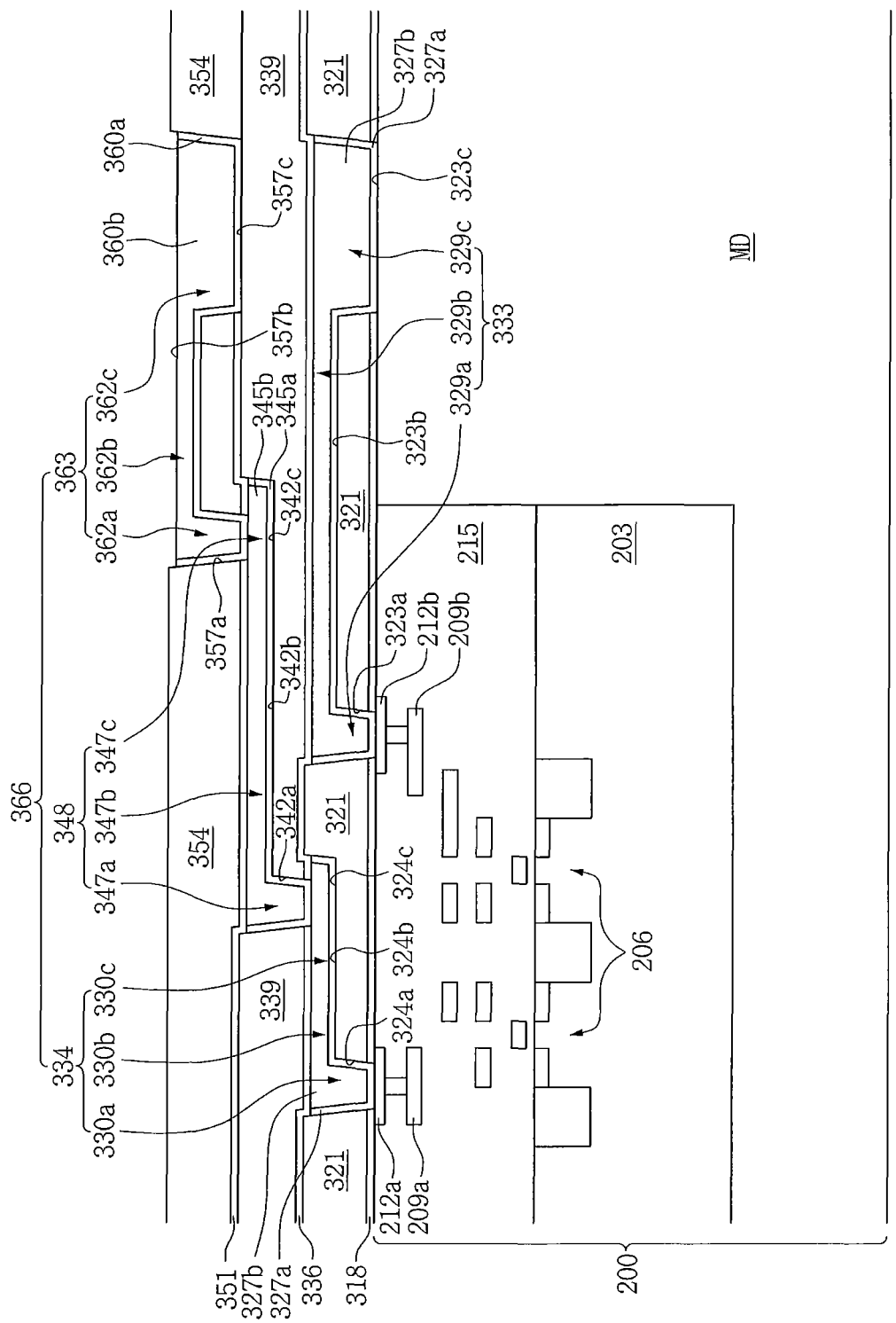

Referring to FIG. 17C, an intermediate insulating barrier layer 351 may be formed to cover the intermediate insulating layer 339 and the intermediate redistribution structure 348. The intermediate insulating barrier layer 351 may be formed of silicon nitride. An upper insulating layer 354 may be formed on the intermediate insulating barrier layer 351. The upper insulating layer 354 may be formed of a photosensitive polyimide material.

An upper contact opening 357a, an upper line recess 357b, and an upper pad opening 357c may be simultaneously formed in the upper insulating layer 354 by exposing and developing the upper insulating layer 354 using substantially the same method as the photolithography process described in FIG. 11B. The upper contact opening 357a and the upper pad opening 357c may pass through the upper insulating layer 354, and the upper line recess 357b may not pass through the upper insulating layer 354. The intermediate pad portion 347c of the intermediate redistribution structure 348 may be exposed by etching the intermediate insulating barrier layer 351 which may be exposed by the upper contact opening 357a.

Next, an upper redistribution structure 363 may be formed in the upper insulating layer 354 using substantially the same method as the method of forming the lower redistribution structure 21 described in FIG. 11C. An upper surface of the upper redistribution structure 363 may be lower than an upper surface of the upper insulating layer 354.

The upper redistribution structure 363 may include an upper contact portion 362a disposed in the upper contact opening 357a, an upper pad portion 362c disposed in the upper pad opening 357c passing through the upper insulating layer 354, and an upper line portion 362b disposed in the upper line recess 357b.

The upper redistribution structure 363 may include a first conductive material layer 360a including a barrier and/or seed layer and a second conductive material layer 360b, which may be formed using an electroplating process using the first conductive material layer 360a as a seed.

Referring again to FIG. 5, an upper insulating barrier layer 369 may be formed to cover the upper insulating layer 354 and the upper redistribution structure 363. The upper insulating barrier layer 369 may be formed of silicon nitride.

A passivation layer 372 may be formed on the upper insulating barrier layer 369. The passivation layer 372 may be formed of a polymer-based insulating material. For example, the passivation layer 372 may be formed of a photosensitive polyimide material. However, the inventive concept is not limited thereto. For example, the passivation layer 372 may be formed of silicon nitride or another insulating material.

An upper opening 375, which exposes the upper pad portion 362c, may be formed by patterning the passivation layer 372.

A connection pattern 378 may be formed on the upper pad portion 362c exposed by the upper opening 375. The connection pattern 378 may include a first connection conductive material layer 376 and a second connection conductive material layer 377 disposed on the first connection conductive material layer 376.

Figure 18:
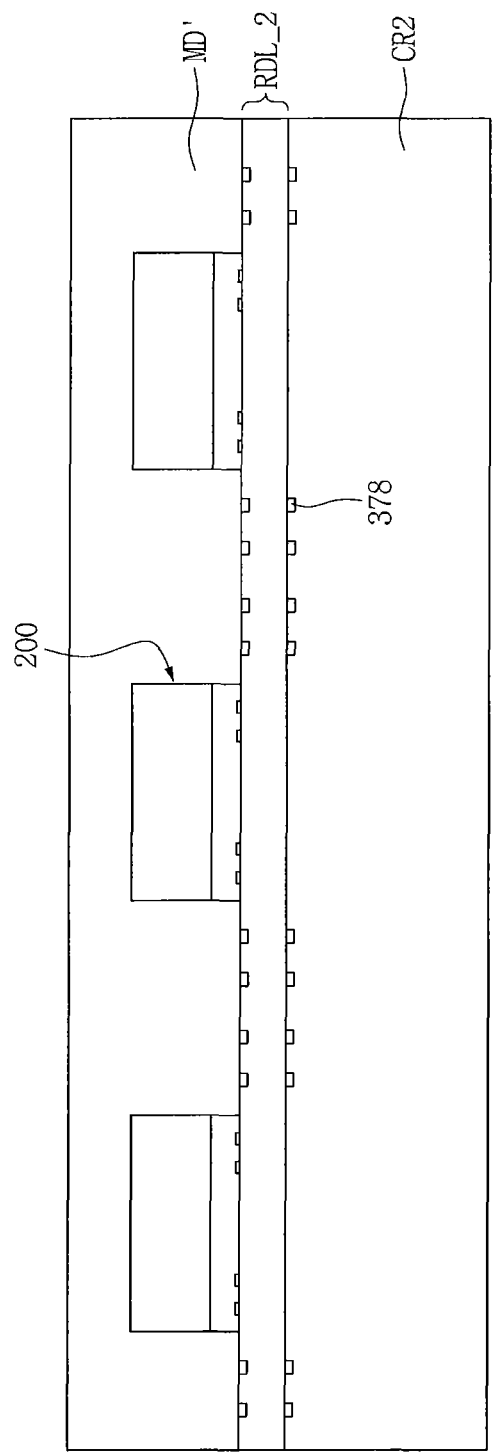

Referring to FIG. 18, the redistribution area RDL_2 and the connection pattern 378 may be bonded to a carrier CR2.

Figure 19:
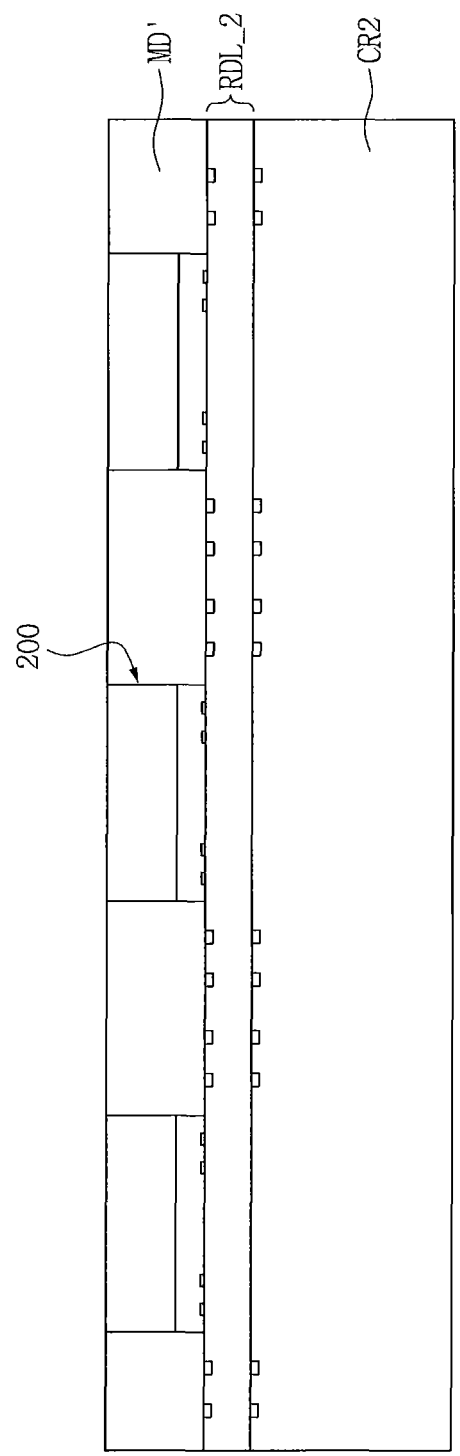

Referring to FIG. 19, a molding pattern MD' may be formed by grinding the molding layer MD until back surfaces of the plurality of semiconductor chips 200 are exposed. In an embodiment, while the molding layer MD is grinded, parts of the back surfaces of the plurality of semiconductor chips 200 are grinded and, thus, thicknesses of the plurality of semiconductor chips 200 may be decreased.

Figure 20:
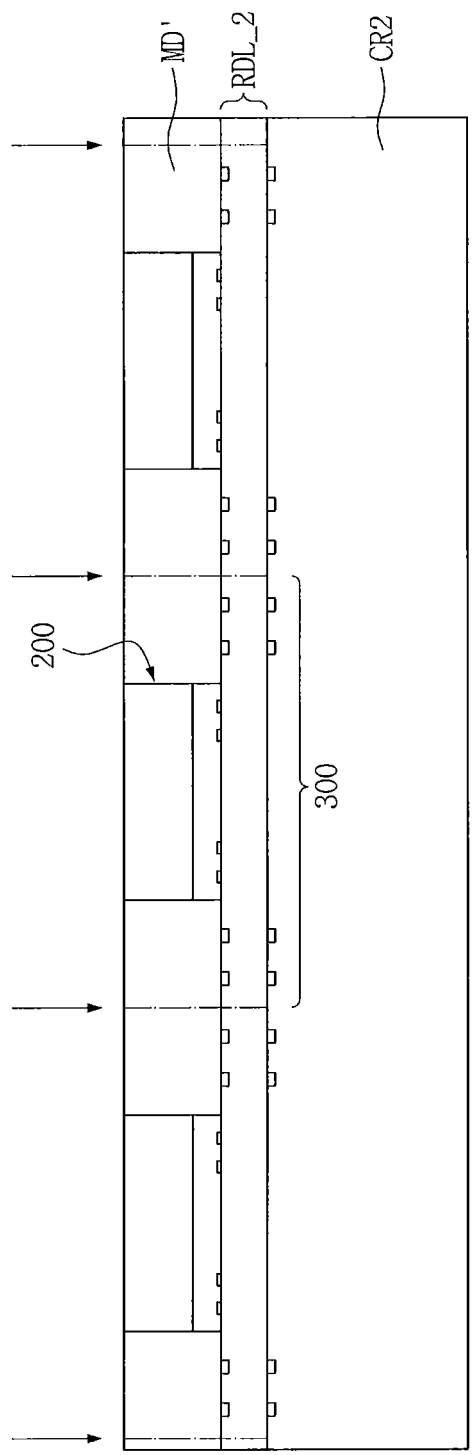

Referring to FIG. 20, a plurality of electronic devices 300 are formed by cutting the molding pattern MD' located between the plurality of semiconductor chips 200 and the redistribution area RDL_2, and the plurality of electronic devices 300 may be separated from the carrier CR2.

The electronic devices according to various embodiments of the inventive concept may include a redistribution area, which may be reliably formed using a simplified manufacturing process. The redistribution area may include a redistribution structure embedded in an insulating layer. The redistribution structure may include a contact portion, a pad portion, and a line portion which connects the contact portion to the pad portion.

The insulating layer may be formed of a photosensitive polyimide material. A contact opening, a line recess, and a pad recess may be simultaneously formed by exposing and developing the insulating layer by performing a photolithography process in which one photomask including parts having different light transmittances is used. The redistribution structure may be formed in the contact opening, the line recess, and the pad recess. Therefore, because the photolithography process for forming the redistribution structure buried in the insulating layer may be simplified, production costs can be reduced.

Because the redistribution structure may be embedded in the insulating layer, defects, such as undercuts, can be prevented from being generated or the likelihood of their generation reduced in the redistribution structure.

In the redistribution structure, because the pad portion may be formed to have a greater thickness than the line portion, the durability and reliability of the pad portion can be improved. For example, when the solder ball or a bump is formed on the pad portion, because the pad portion may be formed to have a greater thickness than the line portion, defects, such as cracks or the like due to stress can be prevented from being generated or the likelihood of their generation reduced in the pad portion.

Although a few embodiments have been described with reference to the accompanying drawings, those skilled in the art will readily appreciate that many modifications are possible in embodiments without departing from the scope of the inventive concept and without changing essential features. Therefore, the above-described embodiments should be considered in a descriptive sense only and not for purposes of limitation.

What is claimed is:

1. An electronic device, comprising:
an upper insulating layer on a substrate;
an upper redistribution structure embedded in the upper insulating layer, wherein the upper redistribution structure comprises an upper contact portion, an upper pad portion, and an upper line portion between the upper contact portion and the upper pad portion;
a passivation layer on the upper insulating layer and the upper redistribution structure; and
an upper opening configured to pass through the passivation layer and expose the upper pad portion,
wherein vertical thicknesses of the upper pad portion and the upper contact portion are greater than a vertical thickness of the upper line portion; and
wherein the upper redistribution structure comprises a first conductive material layer and a second conductive material layer;
wherein the first conductive material layer covers a lower surface and lateral surfaces of the second conductive material layer; and
wherein an upper surface of the first conductive material layer is substantially coplanar with an upper surface of the second conductive material layer.

2. The electronic device of claim 1, wherein:
the upper insulating layer has an upper contact opening, an upper line recess, and an upper pad opening;
the upper contact opening and the upper pad opening pass through the upper insulating layer; and
the upper line recess connects an upper portion of the upper contact opening to an upper portion of the upper pad opening.

3. The electronic device of claim 2, wherein:
the upper contact portion is in the upper contact opening;
the upper pad portion is in the upper pad opening; and
the upper line portion is in the upper line recess.

4. The electronic device of claim 1, wherein upper surfaces of the first and second conductive material layers are lower than an upper surface of the upper insulating layer relative to the substrate.

5. The electronic device of claim 1, wherein the upper insulating layer is formed of a photosensitive polyimide material.

6. The electronic device of claim 1, further comprising:
a lower insulating layer between the upper insulating layer and the substrate; and
a lower redistribution structure in the lower insulating layer and comprising a lower contact portion, a lower pad portion, and a lower line portion disposed between the lower contact portion and the lower pad portion.

7. The electronic device of claim 6, wherein:
the lower insulating layer comprises a lower contact opening, a lower line recess, and a lower pad recess;
the lower contact opening passes through the lower insulating layer;
the lower line recess and the lower pad recess do not pass through the lower insulating layer;
the lower contact portion is in the lower contact opening;
the lower pad portion is in the lower pad recess; and
the lower line portion is in the lower line recess.

8. The electronic device of claim 6, wherein the lower contact portion has a greater vertical thickness than the lower line portion and the lower pad portion.

9. The electronic device of claim 1, further comprising a connection pattern on the upper pad portion exposed by the upper opening.

10. The electronic device of claim 1, wherein an upper surface of the upper contact portion, an upper surface of the upper pad portion, and an upper surface of the upper line portion are substantially coplanar with each other.

11. An electronic device, comprising:
a semiconductor chip;
a molding pattern on lateral surfaces of the semiconductor chip;
a redistribution area configured to cover the semiconductor chip and the molding pattern; and
a connection pattern on the redistribution area,
wherein the redistribution area comprises:
an upper insulating layer configured to cover the semiconductor chip and the molding pattern;
a passivation layer on the upper insulating layer; and
an upper redistribution structure in the upper insulating layer,
the upper redistribution structure comprises an upper contact portion, an upper pad portion, and an upper line portion between the upper contact portion and the upper pad portion,
the upper redistribution structure comprises a first upper conductive material layer and a second upper conductive material layer,
the first upper conductive material layer covers a lower surface and lateral surfaces of the second upper conductive material layer; and
wherein an upper surface of the first upper conductive material layer is substantially coplanar with an upper surface of the second upper conductive material layer.

12. The electronic device of claim 11, wherein the connection pattern is on the upper pad portion of the upper redistribution structure and overlaps the molding pattern.

13. The electronic device of claim 11, wherein the upper pad portion has a greater vertical thickness than the upper line portion.

14. The electronic device of claim 11, further comprising a lower redistribution structure disposed under the upper redistribution structure,
wherein the lower redistribution structure comprises a lower contact portion, a lower pad portion, and a lower line portion between the lower contact portion and the lower pad portion.

15. The electronic device of claim 14, wherein:
the lower pad portion has a same vertical thickness as the lower line portion; and
the upper pad portion has a greater vertical thickness than the upper line portion.

16. An electronic device, comprising:
a substrate;
a lower insulating layer on the substrate;
a lower redistribution structure in the lower insulating layer;
an upper insulating layer on the lower insulating layer; and
an upper redistribution structure in the upper insulating layer, the upper redistribution structure comprising an upper contact portion, an upper pad portion, and an upper line portion that connects the upper contact portion to the upper pad portion, the upper contact portion extending through the upper insulating layer to contact the lower redistribution structure;
wherein the upper redistribution structure comprises a first conductive material layer and a second conductive material layer, and
wherein the first conductive material layer extends from a lower surface of the second conductive material layer to an upper surface of the second conductive material layer to cover whole side surfaces of the second conductive material layer.

17. The electronic device of claim 16, wherein a vertical thickness of the upper contact portion is greater than a vertical thickness of the upper line portion, and a vertical thickness of the upper pad portion is greater than the vertical thickness of the upper line portion.

18. The electronic device of claim 17, wherein an upper surface of the upper redistribution structure is lower than an upper surface of the upper insulating layer relative to the substrate; and
wherein an upper surface of the lower redistribution structure is lower than an upper surface of the lower insulating layer relative to the substrate.

19. The electronic device of claim 18, further comprising:
a passivation layer on the upper insulating layer; and
a connection pattern that extends through an opening in the passivation layer to contact the upper pad portion.

20. The electronic device of claim 19, wherein a planar area of the upper pad portion is greater than a planar area of the upper contact portion; and
wherein the planar area of the upper pad portion is greater than a planar area of a bottom of the connection pattern that contacts the upper pad portion.

* * * * *